United States Patent
Xu et al.

(10) Patent No.: US 10,372,340 B2
(45) Date of Patent: Aug. 6, 2019

(54) DATA DISTRIBUTION METHOD IN STORAGE SYSTEM, DISTRIBUTION APPARATUS, AND STORAGE SYSTEM

(71) Applicant: HUAWEI TECHNOLOGIES CO.,LTD., Shenzhen, Guangdong (CN)

(72) Inventors: Huifeng Xu, Shenzhen (CN); Wei Zha, Chengdu (CN); Yadong Wu, Shenzhen (CN); Baifeng Yu, Hangzhou (CN); Yu Zhang, Shenzhen (CN); Changkun Ma, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 84 days.

(21) Appl. No.: 15/631,888

(22) Filed: Jun. 23, 2017

(65) Prior Publication Data

US 2017/0286283 A1 Oct. 5, 2017

Related U.S. Application Data

(63) Continuation of application No. PCT/CN2014/095231, filed on Dec. 27, 2014.

(51) Int. Cl.
*G06F 12/00* (2006.01)
*G06F 13/00* (2006.01)
(Continued)

(52) U.S. Cl.
CPC .......... *G06F 3/061* (2013.01); *G06F 3/0604* (2013.01); *G06F 3/0617* (2013.01);
(Continued)

(58) Field of Classification Search
CPC ... G06F 3/0604; G06F 3/0683; G06F 12/0868
(Continued)

(56) References Cited

U.S. PATENT DOCUMENTS

| 7,673,168 B2 | 3/2010 | Matsuda | |
|---|---|---|---|
| 2003/0048792 A1* | 3/2003 | Xu | H04L 49/104 370/400 |

(Continued)

FOREIGN PATENT DOCUMENTS

| CN | 100437459 C | 11/2008 |
|---|---|---|
| CN | 102263807 A | 11/2011 |

(Continued)

*Primary Examiner* — Edward J Dudek, Jr.
*Assistant Examiner* — Sidney Li
(74) *Attorney, Agent, or Firm* — Fish & Richardson P.C.

(57) ABSTRACT

Embodiments of the present disclosure provide a storage system, including a distribution apparatus and a storage device; the storage device includes at least two storage controllers and multiple storage units, where each storage unit is configured with any one of the at least two storage controllers as a home storage controller; and the distribution apparatus includes a front-end interface and at least two back-end interfaces, where the front-end interface is configured to connect to a host device, and each back-end interface is connected to each storage controller in a one-to-one correspondence manner. According to the technical solutions provided in the present disclosure, the distribution apparatus parses an IO read/write instruction, so that the IO read/write instruction can be accurately sent to the home storage controller, which avoids forwarding the IO read/write instruction between the storage controllers, thereby improving IO processing efficiency of the storage system.

18 Claims, 6 Drawing Sheets

(51) Int. Cl.
*G06F 13/28* (2006.01)
*G06F 3/06* (2006.01)
*G11C 7/00* (2006.01)
*G06F 12/0868* (2016.01)

(52) U.S. Cl.
CPC .......... *G06F 3/0658* (2013.01); *G06F 3/0683* (2013.01); *G11C 7/00* (2013.01); *G06F 3/0601* (2013.01); *G06F 3/0602* (2013.01); *G06F 3/0631* (2013.01); *G06F 3/0635* (2013.01); *G06F 12/0868* (2013.01)

(58) Field of Classification Search
USPC ........................................................ 711/118
See application file for complete search history.

(56) References Cited

U.S. PATENT DOCUMENTS

| | | | | |
|---|---|---|---|---|
| 2004/0139240 A1* | 7/2004 | DiCorpo | ............... | G06F 3/0617 710/3 |
| 2004/0158764 A1* | 8/2004 | Sonoda | ................. | G06F 3/0611 714/6.1 |
| 2007/0124407 A1 | 5/2007 | Weber et al. | | |
| 2007/0162561 A1 | 7/2007 | Ohara et al. | | |
| 2008/0005517 A1* | 1/2008 | Cholleti | .............. | G06F 12/0223 711/165 |
| 2010/0262979 A1* | 10/2010 | Borchers | ................. | G06F 9/544 719/321 |
| 2011/0296230 A1 | 12/2011 | Chen et al. | | |
| 2012/0166699 A1 | 6/2012 | Kumar et al. | | |
| 2013/0339587 A1* | 12/2013 | Asnaashari | ......... | G06F 12/0246 711/103 |

FOREIGN PATENT DOCUMENTS

| | | |
|---|---|---|
| CN | 102346653 A | 2/2012 |
| CN | 103049225 A | 4/2013 |
| CN | 103701680 A | 4/2014 |
| EP | 2378430 A1 | 10/2011 |

* cited by examiner

DATA DISTRIBUTION METHOD IN STORAGE SYSTEM, DISTRIBUTION APPARATUS, AND STORAGE SYSTEM

CROSS-REFERENCE TO RELATED APPLICATION

This application is a continuation of International Application No. PCT/CN2014/095231, filed on Dec. 27, 2014, the disclosure of which is hereby incorporated by reference in its entirety.

TECHNICAL FIELD

The present disclosure relates to the field of computer technologies, and in particular, to a data distribution method in a storage system, a distribution apparatus, a storage device, and a storage system.

BACKGROUND

FIG. 1 exemplarily describes a storage array 100 with a conventional architecture, and most storage devices in markets use such an architecture, which is typical.

Specifically, the storage array 100 shown in FIG. 1 is a typical storage array of multiple controllers, where the storage array 100 includes an interconnect exchange network 101 and multiple controllers 105 (105-1, 105-2, . . . , 105-n), and the foregoing multiple controllers 105 (105-1, 105-2, . . . , 105-n) are connected by using the interconnection exchange network 101. The controllers each are configured with processors (CPU) (103-1, 103-2, . . . , 103-n) and front-end and back-end interfaces according to a service requirement. Typically, for example, a Fibre Channel FC interface or an Internet small computer system interface iSCSI (102-1, 102-2, . . . , 102-n) is used as a front-end interface to connect to a host device (a peripheral). Typically, for example, a serial attached SCSI (SAS) interface is used as a back-end interface to connect to a storage medium, where the storage medium may be, for example, an HDD or an SSD.

In the architecture shown in FIG. 1, when an operation corresponding to a data request received by a front-end interface chip 102-1 in a controller 1 is performed on an HDD/SSD connected to a controller 2, the controller 1 needs to forward the received data request to the controller 2 by using a network. In such a running manner, a delay of data transmission is not only increased, but also load on the controller 1 is increased, thereby reducing a processing capability of the whole system.

Likewise, in this architecture, once a controller becomes faulty, a system host needs to perform storage access in manners of, for example, using a redundant interface channel or cooperating multipath software.

SUMMARY

In view of this, it is indeed necessary to provide a data distribution method in a storage system, a distribution apparatus, a storage device, and a storage system to improve IO processing efficiency of a storage system.

According to a first aspect, an embodiment of the present disclosure provides a storage system, comprising a storage device including at least two storage controllers and multiple storage units, each storage unit is configured with any one of the at least two storage controllers as a home storage controller;

a distribution apparatus including a front-end interface configured to connect to a host device and at least two back-end interfaces, wherein each back-end interface is configured to connect to each storage controller in a one-to-one correspondence manner; and the distribution apparatus is configured to: receive, using the front-end interface, an IO read/write instruction sent by the host device; determine, according to an identifier of a to-be-read/written storage unit and carried in the IO read/write instruction, a home storage controller corresponding to the to-be-read/written storage unit; and forward, by using a back-end interface connected to the home storage controller corresponding to the to-be-read/written storage unit, the IO read/write instruction to the home storage controller corresponding to the to-be-read/written storage unit.

With reference to the first aspect, in a first possible implementation manner, the distribution apparatus is further configured to save route configuration information, and the route configuration information is used to record a correspondence between each storage unit and the home storage controller configured for each storage unit; and the distribution apparatus is configured to search the route configuration information according to the identifier of the to-be-read/written storage unit and carried in the IO read/write instruction, to determine the home storage controller corresponding to the to-be-read/written storage unit.

With reference to the first possible implementation manner of the first aspect, in a second possible implementation manner, the distribution apparatus is further configured to receive information about a storage unit homed by each storage controller and initially configured in the system, and establish the route configuration information according to the received information about the storage unit homed by each storage controller and initially configured in the system.

With reference to the second possible implementation manner of the first aspect, in a third possible implementation manner, each storage controller is further configured to establish a communication link to the distribution apparatus during system initialization, and send, to the distribution apparatus using the communication link, the information about the storage unit homed by the storage controller and that is initially configured in the system.

With reference to the second or third possible implementation manner of the first aspect, in a fourth possible implementation manner, the distribution apparatus is further configured to receive updated information about the storage unit homed by each storage controller, and update the route configuration information according to the received updated information about the storage unit homed by each storage controller.

With reference to the first aspect or any one of the first to fourth possible implementation manners of the first aspect, in a fifth possible implementation manner, the home storage controller corresponding to the to-be-read/written storage unit is further configured to: after receiving the IO read/write instruction, allocate a storage address from a cache or memory of the home storage controller for the IO read/write instruction, and send the storage address to the distribution apparatus; and the distribution apparatus is further configured to forward the received storage address to the host device.

With reference to the fifth possible implementation manner of the first aspect, in a sixth possible implementation manner, the IO read/write instruction is a write operation instruction, and the home storage controller corresponding to the to-be-read/written storage unit is further configured to receive data corresponding to the IO read/write instruction and written at the storage address by the host device in a direct memory access (DMA) manner.

With reference to the fifth possible implementation manner of the first aspect, in a seventh possible implementation manner, the IO read/write instruction is a read operation instruction, and the home storage controller corresponding to the to-be-read/written storage unit is further configured to receive a direct memory access (DMA) read request sent by the host device according to the storage address, and send, to the host device, data corresponding to the IO read/write instruction and at the storage address.

With reference to the seventh possible implementation manner of the first aspect, in an eighth possible implementation manner, the home storage controller corresponding to the to-be-read/written storage unit is configured to: after receiving the read operation instruction, determine whether the data corresponding to the read operation instruction is saved in the cache or memory of the home storage controller; and if the data corresponding to the read operation instruction is saved in the cache or memory of the home storage controller, acquire the storage address of the data corresponding to the read operation instruction and in the cache or memory of the home storage controller; or if the data corresponding to the read operation instruction is not saved in the cache or memory of the home storage controller, read, from the to-be-read/written storage unit, the data corresponding to the read operation instruction, write the data into the cache or memory of the home storage controller, and use a written address as the storage address.

According to a second aspect, an embodiment of the present disclosure provides a storage system, where the storage system includes a distribution apparatus and a storage device;

the storage device including at least two storage controllers and multiple storage units, where each storage unit is configured with any one of the at least two storage controllers as a home storage controller;

the distribution apparatus includes a processing unit, a host interaction unit, and a switch unit coupled to the processing unit, wherein the host interaction unit is connected to the processing unit using the switch unit;

the host interaction unit is provided with a front-end interface, where the front-end interface is configured to connect to a host device; and the switch unit is provided with at least two back-end interfaces, where each back-end interface is connected to each storage controller in a one-to-one correspondence manner;

the host interaction unit is configured to receive, using the front-end interface, an IO read/write instruction sent by the host device, and forward the IO read/write instruction to the processing unit using the switch unit; and the processing unit is configured to: receive the IO read/write instruction forwarded by the host interaction unit; determine, according to an identifier of a to-be-read/written storage unit and carried in the IO read/write instruction, a home storage controller corresponding to the to-be-read/written storage unit; and forward, using a back-end interface connected to the home storage controller corresponding to the to-be-read/written storage unit and provided in the switch unit, the IO read/write instruction to the home storage controller corresponding to the to-be-read/written storage unit.

With reference to the second aspect, in a first possible implementation manner, a Peripheral Component Interconnect Express (PCIe) link is used for connection between the processing unit and the switch unit and between the host interaction unit and the switch unit, and the processing unit is configured as a PCIe root complex of the host interaction unit and each back-end interface;

the host interaction unit is configured to receive the IO read/write instruction sent by the host device, and send the IO read/write instruction to the PCIe root complex using the PCIe link; and the processing unit, as the PCIe root complex, is configured to receive the IO read/write instruction sent by the host interaction unit using the PCIe link.

With reference to the second aspect or the first possible implementation manner of the second aspect, in a second possible implementation manner, each back-end interface is connected, using a Peripheral Component Interconnect Express (PCIe) non-transparent bridge, to each storage controller that is connected in a one-to-one correspondence manner;

the processing unit is configured to: after receiving the IO read/write instruction, determine a back-end interface connected to the home storage controller corresponding to the to-be-read/written storage unit; fill a destination address of the IO read/write instruction as an address of the back-end interface connected to the home storage controller corresponding to the to-be-read/written storage unit; and send the IO read/write instruction using the PCIe link; and the back-end interface connected to the home storage controller corresponding to the to-be-read/written storage unit is configured to: receive the IO read/write instruction; map the destination address of the IO read/write instruction to an address of the home storage controller corresponding to the to-be-read/written storage unit; and send the IO read/write instruction using the PCIe non-transparent bridge.

With reference to the second aspect, or the first or second possible implementation manner of the second aspect, in a third possible implementation manner, the home storage controller corresponding to the to-be-read/written storage unit is further configured to: after receiving the IO read/write instruction, allocate a storage address from a cache or memory of the home storage controller for the IO read/write instruction, and send the storage address to the processing unit of the distribution apparatus; and the processing unit is further configured to forward the received storage address to the host device, so the host device operates, according to the storage address, data corresponding to the IO read/write instruction.

With reference to the third possible implementation manner of the second aspect, in a fourth possible implementation manner, the IO read/write instruction is a write operation instruction, and the home storage controller corresponding to the to-be-read/written storage unit is further configured to receive the data corresponding to the IO read/write instruction and written at the storage address by the host device in a direct memory access (DMA) manner.

With reference to the third possible implementation manner of the second aspect, in a fifth possible implementation manner, the IO read/write instruction is a read operation instruction, and the home storage controller corresponding to the to-be-read/written storage unit is further configured to receive a direct memory access (DMA) read request sent by the host device according to the storage address, and send, to the host device, the data corresponding to the IO read/write instruction and at the storage address.

With reference to the fifth possible implementation manner of the second aspect, in a sixth possible implementation manner, the home storage controller corresponding to the to-be-read/written storage unit is configured to: after receiving the read operation instruction, determine whether the data corresponding to the read operation instruction is saved in the cache or memory of the home storage controller; and if the data corresponding to the read operation instruction is saved in the cache or memory of the home storage controller, acquire the storage address of the data corresponding to the read operation instruction and in the cache or memory of the home storage controller; or if the data corresponding to the read operation instruction is not saved in the cache or memory of the home storage controller, read, from the to-be-read/written storage unit, the data corresponding to the read operation instruction, write the data into the cache or memory of the home storage controller, and use a written address as the storage address.

With reference to the second aspect, or any one of the first to sixth possible implementation manners of the second aspect, in a seventh possible implementation manner, the distribution apparatus is further configured to save route configuration information, and the route configuration information is used to record a correspondence between each storage unit and the home storage controller configured for each storage unit; and the processing unit is configured to search the route configuration information according to the identifier of the to-be-read/written storage unit and carried in the IO read/write instruction, to determine the home storage controller corresponding to the to-be-read/written storage unit.

With reference to the seventh possible implementation manner of the second aspect, in an eighth possible implementation manner, the processing unit is further configured to receive information about a storage unit homed by each storage controller and initially configured in the system, and establish the route configuration information according to the received information about the storage unit homed by each storage controller and initially configured in the system.

With reference to the eighth possible implementation manner of the second aspect, in a ninth possible implementation manner, each storage controller is further configured to establish a communication link to the distribution apparatus during system initialization, and send, to the processing unit of the distribution apparatus using the communication link, the information about the storage unit homed by the storage controller and initially configured in the system.

With reference to the eighth or ninth possible implementation manner of the second aspect, in a tenth possible implementation manner, the processing unit is further configured to receive updated information about the storage unit homed by each storage controller, and update the route configuration information according to the received updated information about the storage unit homed by each storage controller.

According to a third aspect, an embodiment of the present disclosure provides a distribution apparatus including a processing unit, a host interaction unit, and a switch unit coupled to the processing unit, wherein the host interaction unit is connected to the processing unit using the switch unit;

the host interaction unit is provided with a front-end interface, where the front-end interface is configured to connect to a host device; and the switch unit is provided with at least two back-end interfaces, and the at least two back-end interfaces are configured to connect to at least two storage controllers in a storage device, where each back-end interface is connected to each storage controller in a one-to-one correspondence manner, and each storage unit of the storage device is configured with any one of the at least two storage controllers as a home storage controller;

the host interaction unit is configured to receive, using the front-end interface, an IO read/write instruction sent by the host device, and forward the IO read/write instruction to the processing unit using the switch unit; and the processing unit is configured to: receive the IO read/write instruction forwarded by the host interaction unit; determine, according to an identifier of a to-be-read/written storage unit and carried in the IO read/write instruction, a home storage controller corresponding to the to-be-read/written storage unit; and forward, using a back-end interface connected to the home storage controller corresponding to the to-be-read/written storage unit and provided in the switch unit, the IO read/write instruction to the home storage controller corresponding to the to-be-read/written storage unit.

With reference to the third aspect, in a first possible implementation manner, the distribution apparatus is further configured to save route configuration information, and the route configuration information is used to record a correspondence between each storage unit and the home storage controller configured for each storage unit; and the processing unit is configured to search the route configuration information according to the identifier of the to-be-read/written storage unit and carried in the IO read/write instruction, to determine the home storage controller corresponding to the to-be-read/written storage unit.

With reference to the first possible implementation manner of the third aspect, in a second possible implementation manner, the processing unit is further configured to receive information about a storage unit homed by each storage controller and initially configured in a system, and establish the route configuration information according to the received information about the storage unit homed by each storage controller and initially configured in the system.

With reference to the second possible implementation manner of the third aspect, in a third possible implementation manner, the processing unit is further configured to receive updated information about the storage unit homed by each storage controller, and update the route configuration information according to the received updated information about the storage unit homed by each storage controller.

With reference to the third aspect, or any one of the first to third possible implementation manners of the third aspect, in a fourth possible implementation manner, the processing unit is further configured to receive a storage address sent by the home storage controller corresponding to the to-be-read/written storage unit, and forward the received storage address to the host device, so that the host device operates, according to the storage address, data corresponding to the IO read/write instruction, where the storage address is allocated from a cache or memory of the home storage controller for the IO read/write instruction after the home storage controller corresponding to the to-be-read/written storage unit receives the IO read/write instruction.

With reference to the third aspect, or any one of the first to fourth possible implementation manners of the third aspect, in a fifth possible implementation manner, a Peripheral Component Interconnect Express (PCIe) link is used for connection between the processing unit and the switch unit and between the host interaction unit and the switch unit, and the processing unit is configured as a PCIe root complex of the host interaction unit and each back-end interface;

the host interaction unit is configured to receive the IO read/write instruction sent by the host device, and send the IO read/write instruction to the PCIe root complex using the PCIe link; and the processing unit, as the PCIe root complex, is configured to receive the IO read/write instruction sent by the host interaction unit using the PCIe link.

With reference to the third aspect, or any one of the foregoing possible implementation manners of the third aspect, in a sixth possible implementation manner, each back-end interface is connected, using a Peripheral Component Interconnect Express (PCIe) non-transparent bridge, to each storage controller connected in a one-to-one correspondence manner;

the processing unit is configured to: after receiving the IO read/write instruction, determine the back-end interface connected to the home storage controller corresponding to the to-be-read/written storage unit; fill a destination address of the IO read/write instruction as an address of the back-end interface connected to the home storage controller corresponding to the to-be-read/written storage unit; and send the IO read/write instruction using the PCIe link; and the back-end interface connected to the home storage controller corresponding to the to-be-read/written storage unit is configured to: receive the IO read/write instruction; map the destination address of the IO read/write instruction to an address of the home storage controller corresponding to the to-be-read/written storage unit; and send the IO read/write instruction using the PCIe non-transparent bridge.

According to a fourth aspect, an embodiment of the present disclosure provides a data distribution method, where the method is applied in a storage system, the storage system includes a distribution apparatus and a storage device, the storage device includes at least two storage controllers and multiple storage units, each storage unit is configured with any one of the at least two storage controllers as a home storage controller, the distribution apparatus includes a front-end interface and at least two back-end interfaces, the front-end interface is configured to connect to a host device, and each back-end interface is connected to each storage controller in a one-to-one correspondence manner; and the method includes:

receiving, by the distribution apparatus using the front-end interface, an IO read/write instruction sent by the host device, where the IO read/write instruction carries an identifier of a to-be-read/written storage unit;

determining, by the distribution apparatus, a home storage controller of the to-be-read/written storage unit according to the identifier of the to-be-read/written storage unit; and forwarding, by the distribution apparatus, the IO read/write instruction to the home storage controller of the to-be-read/written storage unit using a back-end interface connected to the home storage controller of the to-be-read/written storage unit.

With reference to the fourth aspect, in a first possible implementation manner, the method further includes:

receiving, by the distribution apparatus, a storage address sent by the home storage controller of the to-be-read/written storage unit, where the storage address is allocated from a cache or memory of the home storage controller for the IO read/write instruction after the home storage controller corresponding to the to-be-read/written storage unit receives the IO read/write instruction; and forwarding, by the distribution apparatus, the storage address to the host device, so that the host device operates, according to the storage address, data corresponding to the IO read/write instruction.

With reference to the first possible implementation manner of the fourth aspect, in a second possible implementation manner, the IO read/write instruction is a write operation instruction, and after the forwarding, by the distribution apparatus, the storage address to the host device, the method further includes:

receiving, by the distribution apparatus, a write operation end instruction sent by the host device, where the write operation end instruction is used to indicate that the host device has written, into the storage address in a direct memory access (DMA) manner, all data corresponding to the write operation instruction; and forwarding, by the distribution apparatus, the write operation end instruction to the home storage controller of the to-be-read/written storage unit.

With reference to the first possible implementation manner of the fourth aspect, in a third possible implementation manner, the IO read/write instruction is a read operation instruction, and after the forwarding, by the distribution apparatus, the storage address to the host device, the method further includes:

receiving, by the distribution apparatus, a read operation end instruction sent by the home storage controller of the to-be-read/written storage unit, where the read operation end instruction is used to indicate that the home storage controller of the to-be-read/written storage unit has sent, to the host device in a direct memory access (DMA) manner, all data corresponding to the read operation instruction; and forwarding, by the distribution apparatus, the read operation end instruction to the host device.

With reference to the fourth aspect, or any one of the first to third possible implementation manners of the fourth aspect, in a fourth possible implementation manner, the determining, by the distribution apparatus, a home storage controller of the to-be-read/written storage unit according to the identifier of the to-be-read/written storage unit includes:

searching, by the distribution apparatus, route configuration information according to the identifier of the to-be-read/written storage unit and carried in the IO read/write instruction, to determine the home storage controller corresponding to the to-be-read/written storage unit, where the route configuration information is used to record a correspondence between each storage unit and the home storage controller configured for each storage unit.

With reference to the fourth possible implementation manner of the fourth aspect, in a fifth possible implementation manner, before the receiving, by the distribution apparatus using the front-end interface, an IO read/write instruction sent by the host device, the method further includes:

receiving, by the distribution apparatus, information about a storage unit homed by each storage controller and initially configured in the system, and establishing the route configuration information according to the received information about the storage unit homed by each storage controller and initially configured in the system.

With reference to the fifth possible implementation manner of the fourth aspect, in a sixth possible implementation manner, after the establishing the route configuration information, the method further includes:

receiving, by the distribution apparatus, updated information about the storage unit homed by each storage controller, and updating the route configuration information according to the received updated information about the storage unit homed by each storage controller.

According to the technical solutions provided in the embodiments of the present disclosure, a distribution apparatus can accurately send an IO read/write instruction to a home storage controller, which avoids forwarding the IO read/write instruction between storage controllers, thereby improving IO processing efficiency of a storage system.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

Now, refer to the embodiments described in the accompanying drawings for details. To understand the present disclosure, the following detailed description mentions many specific details; however, a person of ordinary skill in the art should understand that the present disclosure may be implemented without these specific details. In some embodiments, a well-known method, process, component and circuit are not described in detail, to avoid unnecessarily blurring the embodiments.

Figure 1:
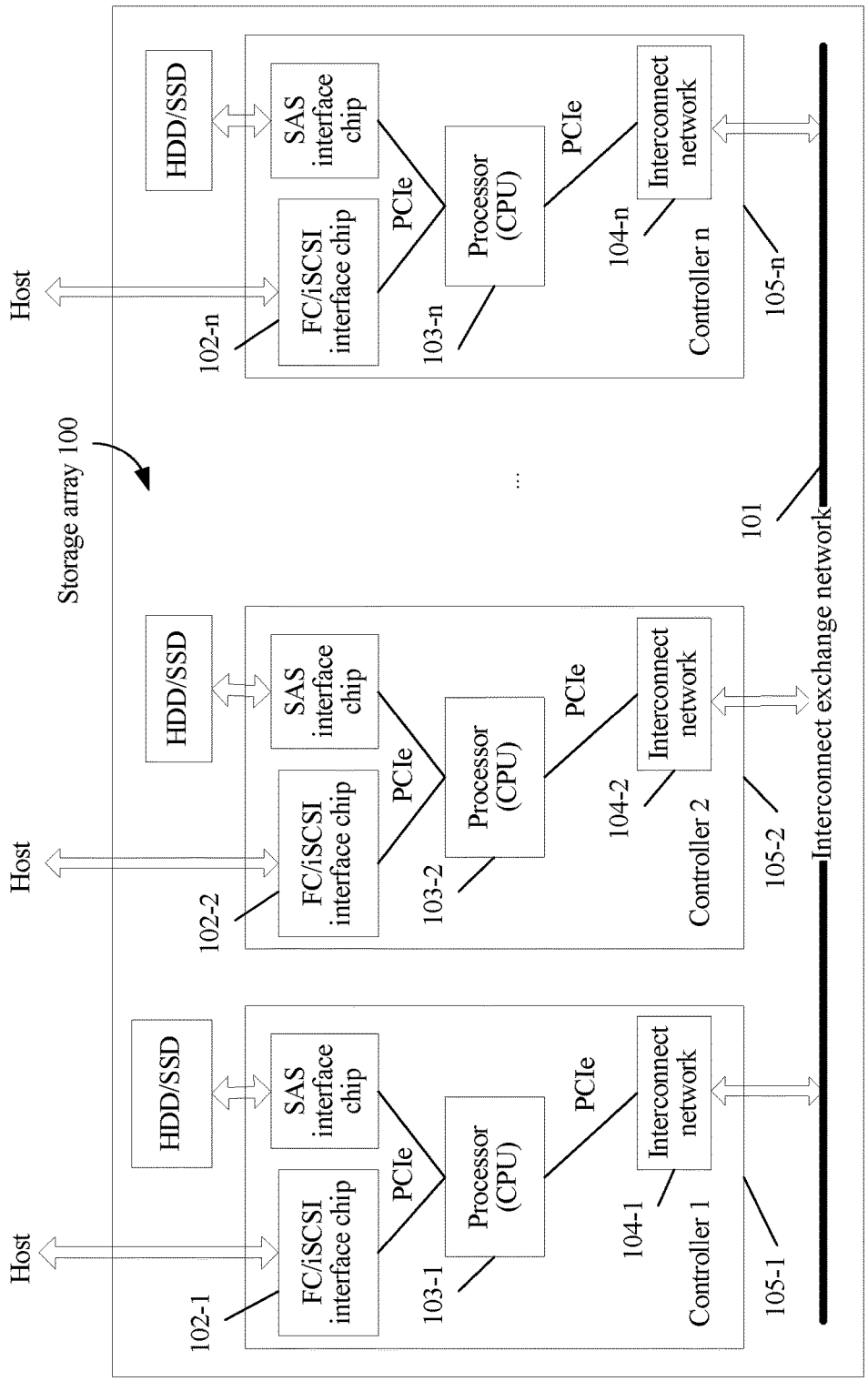
FIG. 1 is a schematic diagram of a logical structure of a storage array 100 with a converged infrastructure architecture in the prior art.
Figure 2:
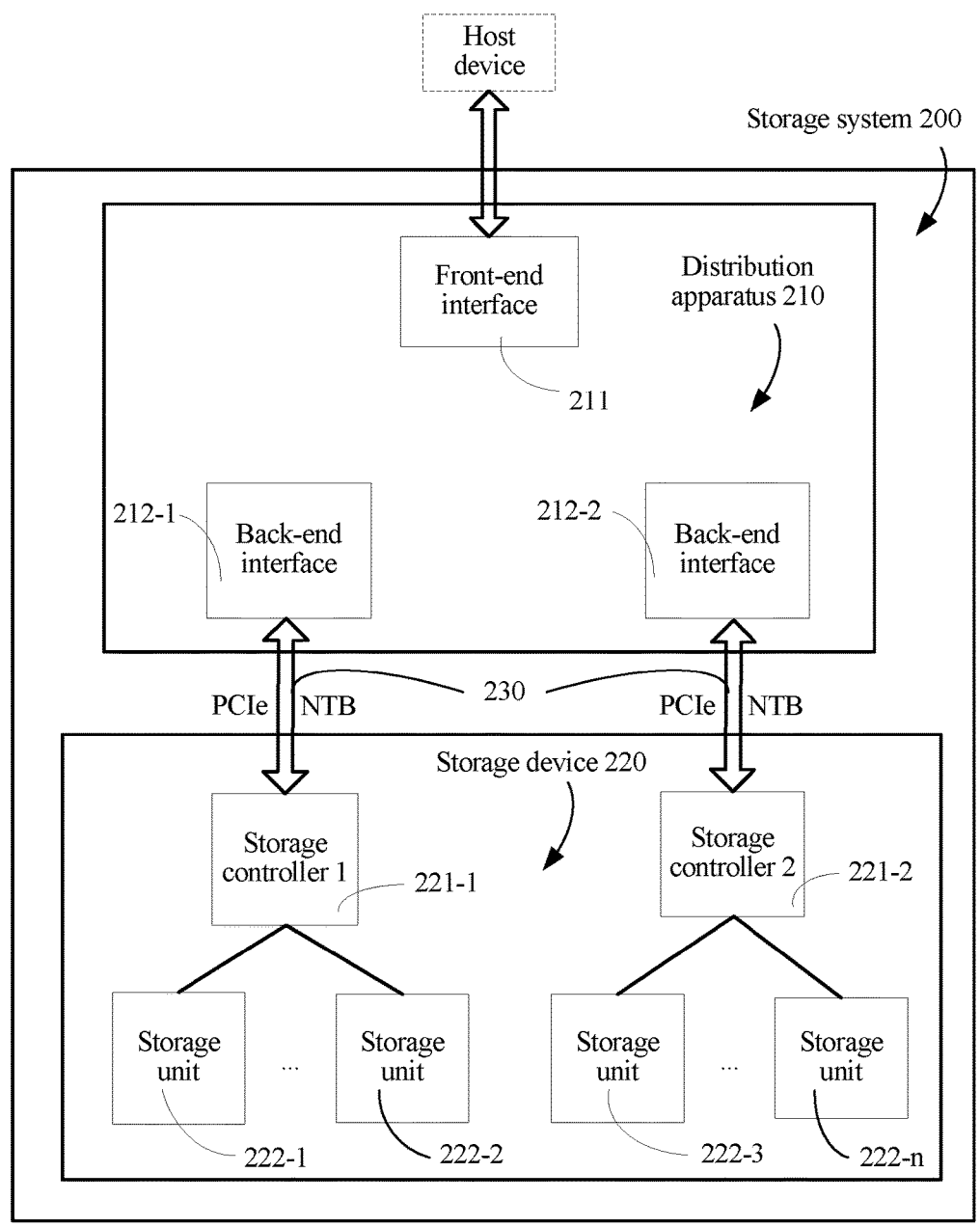
FIG. 2 is a schematic diagram of a logical structure of a storage system 200 according to an embodiment of the present disclosure.

To facilitate understanding and implementation, an embodiment of the present disclosure first provides a storage system 200. FIG. 2 shows a schematic diagram of a logical structure of the storage system 200, where the storage system 200 includes a distribution apparatus 210 and a storage device 220.

The storage device 220 includes a storage controller 221-1, a storage controller 221-2 (a quantity of storage controllers is not considered as a limitation on the embodiment of this solution, an adjustment may be made to the system as required at any time, and two controllers herein are used as an example only for ease of description), and multiple storage units 222-1, 222-2, 222-3, . . . , 222-n, where each storage unit is configured with either one of the two storage controllers 221-1 and 221-2 as a home storage controller. In a specific implementation process, the multiple storage units 222-1, 222-2, 222-3, . . . , 222-n may be implemented by using, for example but not limited to, an EEPROM, a ROM, a solid state drive (SSD), a hard disk drive (HDD), a magnetic tape, an optical hard disk, or another nonvolatile storage apparatus. Merely as an example instead of a limitation, the multiple storage units may be multiple sectors or multiple blocks/chunks data blocks on a magnetic disk. In addition, it should be noted that the multiple storage units 222-1, 222-2, 222-3, . . . , 222-n may implement a combination in a software or hardware manner to become a storage array similar to a Just a Bunch Of Disks (JBOD), where the combination can be implemented by a person of ordinary skill in the art and should fall within the protection scope of this solution.

The distribution apparatus 210 includes a front-end interface and at least two back-end interfaces (for ease of description, as an example instead of a limitation, FIG. 2 shows only one front-end interface 211 and two back-end interfaces 212-1 and 212-2), where the front-end interface indicates a first-type interface on the distribution apparatus 210, and the first-type interface is configured to connect to a host device. It should be noted that this embodiment of the present disclosure does not limit a type or quantity of the front-end interface on the distribution apparatus 210. The at least two back-end interfaces indicate second-type interfaces (this embodiment of the present disclosure does not limit a type of the back-end interfaces either, and the system may be flexibly configured according to an actual requirement) on the distribution apparatus. There are at least two of the second-type interfaces, where each back-end interface is configured to connect to each storage controller in a one-to-one correspondence manner. For example, the back-end interface 212-1 is connected to the storage controller 221-1, and the back-end interface 212-2 is connected to the storage controller 221-2. It should be noted that: that each back-end interface is connected to each storage controller in a one-to-one correspondence manner does not mean that each back-end interface and each storage controller are bound to each other in an unchangeable manner, but is merely intended to describe a one-to-one correspondence between each back-end interface and each storage controller. In actual work, the one-to-one correspondence may be changed in the system as required at any time, that is, the one-to-one correspondence between each back-end interface and each storage controller is dynamically adjustable.

The distribution apparatus 210 may receive, by using the front-end interface 211, an IO read/write instruction sent by the host device, determine, according to an identifier that is of a to-be-read/written storage unit and that is carried in the IO read/write instruction, a home storage controller corresponding to the to-be-read/written storage unit (as an example instead of a limitation, the identifier of the to-be-read/written storage unit may be a logical unit number (LUN)), and forward, by using a back-end interface connected to the home storage controller corresponding to the to-be-read/written storage unit, the IO read/write instruction to the home storage controller corresponding to the to-be-read/written storage unit (in the storage system 200, the home storage controller corresponding to the to-be-read/written storage unit is either one of the storage controllers 221-1 and 221-2).

In this embodiment of the present disclosure, the distribution apparatus 210 is disposed between the host device (not numbered in the figure) and the storage device 220, and the front-end interface 211 connected to the host device is no longer provided on the storage controller but provided on the distribution apparatus 210, so that the front-end interface 211 is decoupled from the storage controller. Therefore, the distribution apparatus 210 first receives the IO read/write instruction from the host device, then may determine, according to the received IO read/write instruction, the home storage controller corresponding to the to-be-read/written storage unit, and directly forwards the IO read/write instruction to the home storage controller corresponding to the to-be-read/written storage unit, so that the IO read/write instruction no longer needs to undergo a forwarding process between the storage controllers and a storage controller not related to each IO read/write instruction no longer forwards the IO read/write instruction, which alleviates unnecessary load on the storage controllers. The IO read/write instruction is directly forwarded to the corresponding home storage controller, which can further reduce a transmission delay of the IO read/write instruction.

In addition, the distribution apparatus 210 in this embodiment of the present disclosure is disposed between the host device and the storage device 220, so that the front-end interface 211 is decoupled from the storage controller, which may further resolve a problem in the prior art, for example, an interface chip 102-1 corresponding to a storage controller 105-1 can no longer be used when the storage controller 105-1 becomes faulty. Use of the front-end interface 210 in this embodiment of the present disclosure is independent of whether the storage controller is faulty or not, which can improve utilization of a device in the system.

In this embodiment of the present disclosure, to ensure that the distribution apparatus 210 can determine the home storage controller corresponding to the IO read/write instruction, route configuration information may be further configured in the distribution apparatus 210, where the route configuration information is used to record a correspondence between each storage unit and a home storage controller configured for each storage unit. The distribution apparatus 210 is specifically configured to search the route configuration information according to the identifier that is of the to-be-read/written storage unit and that is carried in the IO read/write instruction, to determine the home storage controller corresponding to the to-be-read/written storage unit. In a specific implementation process, the route configuration information may be saved in any component that has a storage function and that is in the distribution apparatus 210, or a saving unit is separately configured in the distribution apparatus 210 to save the foregoing route configuration information.

In this embodiment of the present disclosure, the route configuration information is configured in the distribution apparatus 210, so that the distribution apparatus 210 can accurately and quickly determine the storage controller homing the to-be-read/written storage unit carried in the IO read/write instruction, thereby improving efficiency in distributing the IO read/write instruction by the system.

Optionally, the distribution apparatus 210 is further configured to receive information that is about a storage unit homed by each storage controller (the storage controller 221-1 or 221-2) and that is initially configured in the storage system 200, and establish the foregoing route configuration information according to the received information that is about the storage unit homed by each storage controller and that is initially configured in the storage system 200.

Optionally, each storage controller (the storage controller 221-1 or 221-2) is further configured to establish a communication link 230 to the distribution apparatus 210 during system initialization, and send, to the distribution apparatus 210 by using the communication link 230, the information that is about the storage unit homed by the storage controller and that is initially configured in the system. After receiving the information that is about the storage unit homed by each storage controller, that is initially configured in the system, and that is sent by each storage controller, the distribution apparatus 210 establishes the foregoing route configuration information. In a specific implementation process, the communication link 230 may be constructed and implemented in a manner of, for example but not limited to, a hardware plug-in card, a cable, or an optical cable. In addition, the communication link 230 may use multiple communications protocols or mechanisms for communication. Preferably, the communication link 230 in this embodiment uses a Peripheral Component Interconnect Express non-transparent bridge (PCIe NTB) for communication. In this case, the at least two back-end interfaces may be PCIe NTB interfaces In this embodiment of the present disclosure, the communication link 230 is established between the distribution apparatus 210 and each storage controller (the storage controller 221-1 or 221-2), so that a connection manner between the distribution apparatus and the storage controller is free and flexible, which can be maintained and updated anytime, thereby improving utilization of a device in the system.

Optionally, the distribution apparatus 210 is further configured to receive updated information about the storage unit homed by each storage controller, and update the foregoing route configuration information according to the received updated information about the storage unit homed by each storage controller. It should be noted that: merely as an example, in a specific implementation process, the updated information about the storage unit homed by each storage controller is determined by the storage controllers 221-1 and 221-2 after negotiation, and is sent to the distribution apparatus 210 by either one of the storage controllers 221-1 and 221-2, or is sent to the distribution apparatus 210 after being determined by a separate third-party management server, where the third-party management server is specially configured to manage and coordinate correspondences between the storage units and the storage controllers in the system.

In this embodiment of the present disclosure, the distribution apparatus 210 can receive the updated information about the storage unit homed by each storage controller and update the foregoing route configuration information, so that homing relationships between the storage units and the storage controllers in the storage system become flexible and changeable, and a load balance among the storage controllers in the storage system can be implemented. In addition, once a storage controller becomes faulty, the system can allocate, in time, a storage unit originally homed by the faulty storage controller to another storage controller that works normally, thereby improving reliability of the system.

Optionally, the home storage controller corresponding to the to-be-read/written storage unit is further configured to: after receiving the IO read/write instruction, allocate a storage address from a cache or memory of the home storage controller for the IO read/write instruction, and send the storage address to the distribution apparatus 210. The distribution apparatus is further configured to forward the received storage address to the host device (so that the host device operates, according to the storage address, data corresponding to the IO read/write instruction).

In this embodiment of the present disclosure, after receiving the IO read/write instruction, the home storage controller corresponding to the to-be-read/written storage unit can allocate the storage address from the cache or memory of the home storage controller for the IO read/write instruction, and send the storage address to the distribution apparatus, so that the distribution apparatus forwards the storage address to the host device. Therefore, the host device can directly learn an operation address of the data corresponding to the IO read/write instruction, which avoids a defect of a large scale of system data exchange caused by receiving data at and forwarding data between different storage controllers, and also reduces a delay brought by data exchange between the storage controllers.

Optionally, the IO read/write instruction is a write operation instruction, and the home storage controller corresponding to the to-be-read/written storage unit is further configured to receive data that is corresponding to the IO read/write instruction and that is written at the storage address by the host device in a direct memory access DMA manner.

In this embodiment of the present disclosure, when the IO read/write instruction is the write operation instruction, the host device directly writes, in the DMA manner into a storage controller corresponding to a write operation, the data corresponding to the write operation instruction, which implements fast writing of data. In addition, the DMA manner does not need involvement of the distribution apparatus, thereby reducing work load on the distribution apparatus and improving IO efficiency of the system.

Optionally, the IO read/write instruction is a read operation instruction, and the home storage controller corresponding to the to-be-read/written storage unit is further configured to receive a direct memory access DMA read request that is sent by the host device according to the storage address, and send, to the host device, data that is corresponding to the IO read/write instruction and that is at the storage address.

In this embodiment of the present disclosure, when the IO read/write instruction is the read operation instruction, a storage controller corresponding to the read operation instruction directly writes, in the DMA manner into the host device, the data corresponding to the read operation instruction, which implements fast reading of data. In addition, the DMA manner does not need involvement of the distribution apparatus, thereby reducing work load on the distribution apparatus and improving IO efficiency of the system.

Specifically, when the IO read/write instruction is the read operation instruction, the home storage controller corresponding to the to-be-read/written storage unit is specifically configured to: after receiving the read operation instruction, determine whether the data corresponding to the read operation instruction is saved in the cache or memory of the home storage controller; and if the data corresponding to the read operation instruction is saved in the cache or memory of the home storage controller, acquire the storage address of the data that is corresponding to the read operation instruction and that is in the cache or memory of the home storage controller; or if the data corresponding to the read operation instruction is not saved in the cache or memory of the home storage controller, read, from the to-be-read/written storage unit, the data corresponding to the read operation instruction, write the data into the cache or memory of the home storage controller, and use a written address as the storage address. Certainly, in a specific implementation process, preferably, the storage controller may collect hotspot statistics on data, and save, in the cache or memory of the storage controller by using a statistics collecting method, for example but not limited to, an least recently used (LRU) algorithm, data frequently accessed by the host device, so as to improve efficiency of a read operation.

Further, the distribution apparatus 210 may further include a processing unit (not shown), and a Peripheral Component Interconnect Express PCIe link may be used for connection between the front-end interface 211 and the processing unit, where the processing unit is configured as a PCIe root complex (PCIe Root Complex) of the front-end interface 211.

The front-end interface 211 is specifically configured to receive the IO read/write instruction sent by the host device, and send the IO read/write instruction to the PCIe root complex (namely, the processing unit).

The processing unit, as the PCIe root complex, is specifically configured to receive the IO read/write instruction that is sent by the front-end interface 211 by using the PCIe link. Preferably, the processing unit may be an embedded processor CPU.

Likewise, further, a PCIe link is used for connection between each back-end interface and the foregoing processing unit, the processing unit is configured as a PCIe root complex of each back-end interface, and each back-end interface is connected, by using a PCIe non-transparent bridge (PCIe NTB), to each storage controller that is connected in a one-to-one correspondence manner.

The processing unit is specifically configured to: after receiving the IO read/write instruction, determine a back-end interface connected to the home storage controller corresponding to the to-be-read/written storage unit; fill a destination address of the IO read/write instruction as an address of the back-end interface connected to the home storage controller corresponding to the to-be-read/written storage unit; and send the IO read/write instruction by using the PCIe link.

The back-end interface connected to the home storage controller corresponding to the to-be-read/written storage unit is configured to: receive the IO read/write instruction; map the destination address of the IO read/write instruction to an address of the home storage controller corresponding to the to-be-read/written storage unit; and send the IO read/write instruction by using the PCIe non-transparent bridge (such an operation is required in a PCIe NTB communications protocol, where an NTB is essentially: performing mapping between memories of two domains, writing packet data at an address mapped by the peer, and then writing data at an address of the peer by using the NTB, where the back-end interface in this embodiment is configured to implement this work).

According to the technical solution provided in this embodiment of the present disclosure, a same PCIe domain is formed among a processing unit, a front-end interface, and back-end interfaces in a distribution apparatus 210, and the same processing unit manages and deploys the front-end interface and the back-end interfaces, thereby improving work performance of the distribution apparatus. In addition, the processing unit may be a commercial embedded processor and does not need to be an application-specific integrated circuit ASIC component, which has low costs and is easy to implement.

Further, in addition to the processing unit, the distribution apparatus 210 may further include a host interaction unit (not shown) and a switch unit (not shown), where the switch unit is connected to the processing unit, and the host interaction unit is connected to the processing unit by using the switch unit.

The host interaction unit is provided with the front-end interface, and the switch unit is provided with the at least two back-end interfaces. In specific implementation, a Peripheral Component Interconnect Express PCIe link is used for connection between the processing unit and the switch unit and between the host interaction unit and the switch unit, and the processing unit is configured as a PCIe root complex of the host interaction unit and the switch unit (specifically each back-end interface). In this case, the host interaction unit is specifically configured to convert, into a data packet using the PCIe communications protocol, a data packet that carries the IO read/write instruction and that is sent by the host device. It should be noted that this embodiment of the present disclosure does not limit a quantity of the host interaction unit and the front-end interface. In the system, one host interaction unit may be deployed, where the one host interaction unit is configured with multiple front-end interfaces; or multiple host interaction units may be deployed, where each host interaction unit is configured with multiple front-end interfaces; or multiple host interaction units may be deployed, where each host interaction unit is configured with one front-end interface.

Figure 3:
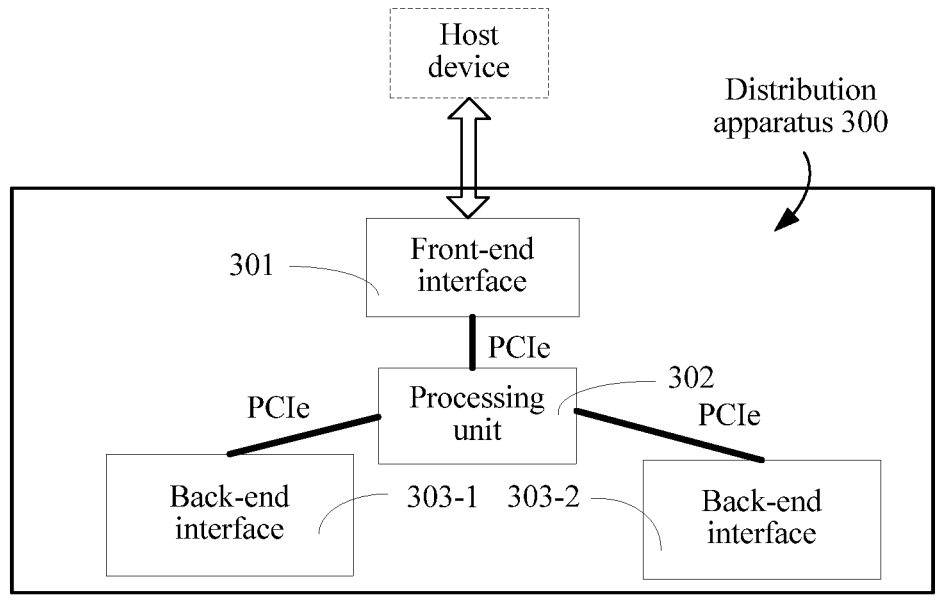
FIG. 3 is a schematic diagram of a logical structure of a distribution apparatus 300 according to an embodiment of the present disclosure.

FIG. 3 is a schematic diagram of a logical structure of a distribution apparatus 300 according to an embodiment of the present disclosure. As shown in FIG. 3, the distribution apparatus 300 is a variation of the distribution apparatus 210 in FIG. 2. The following describes in detail the distribution apparatus 300, and meanwhile, in this embodiment, a well-known method, process, component and circuit are not described in detail, to avoid unnecessarily blurring this embodiment.

As shown in FIG. 3, the distribution apparatus 300 may include a processing unit 302, a front-end interface 301, and at least two back-end interfaces 303-1 and 303-2 (for ease of description, as an example instead of a limitation, FIG. 3 shows only one front-end interface 301 and two back-end interfaces 303-1 and 303-2). Functions of the front-end interface 301 and the at least two back-end interfaces 303-1 and 303-2 are respectively the same as those of the front-end interface 211 and the back-end interfaces 212-1 and 212-2 in FIG. 2, and details are not described herein again. Merely as an example, when the distribution apparatus 300 is applied in the storage system 200, the at least two back-end interfaces 303-1 and 303-2 are configured to connect to the storage controllers 221-1 and 221-2 in a one-to-one correspondence manner. For example, the back-end interface 303-1 is connected to the storage controller 221-1, and the back-end interface 303-2 is connected to the storage controller 221-2 (not shown).

The processing unit 302 is configured to: receive, by using the front-end interface 301, an IO read/write instruction sent by a host device; determine, according to an identifier that is of a to-be-read/written storage unit and that is carried in the IO read/write instruction, a home storage controller corresponding to the to-be-read/written storage unit; and forward, by using a back-end interface connected to the home storage controller corresponding to the to-be-read/written storage unit, the IO read/write instruction to the home storage controller corresponding to the to-be-read/written storage unit.

According to the technical solution provided in this embodiment of the present disclosure, the front-end interface 301 on the distribution apparatus 300 is decoupled from the storage controllers. The front-end interface 301 is responsible for receiving the IO read/write instruction sent by the host device, the processing unit is responsible for determining a storage controller to which the IO read/write instruction is to be sent (the home storage controller corresponding to the to-be-read/written storage unit), and the back-end interface connected to the home storage controller corresponding to the to-be-read/written storage unit is responsible for sending the IO read/write instruction to the storage controller determined by the processing unit, which avoids forwarding of an IO read/write instruction between storage controllers in the prior art, and reduces a transmission delay of the IO read/write instruction.

Further, as shown in FIG. 3, route configuration information may further be configured in the distribution apparatus 300 (a function of the route configuration information is the same as that described in the embodiment corresponding to FIG. 2, and details are not described herein again). The processing unit 302 is specifically configured to search the route configuration information according to the identifier that is of the to-be-read/written storage unit and that is carried in the IO read/write instruction, to determine the home storage controller corresponding to the to-be-read/written storage unit. In a specific implementation process, preferably, in order to help the processing unit 302 to search the route configuration information, the route configuration information may be saved in the processing unit 302. Merely as an example, when the processing unit 302 is an embedded processor CPU, the route configuration information may be saved in a register or a high-speed cache of the CPU.

Specifically, the processing unit 302 is further configured to receive information that is about a storage unit homed by each storage controller and that is initially configured in the system, and establish the foregoing route configuration information according to the received information that is about the storage unit homed by each storage controller and that is initially configured in the system.

Optionally, the processing unit 302 is further configured to receive updated information about the storage unit homed by each storage controller, and update the foregoing route configuration information according to the received updated information about the storage unit homed by each storage controller.

Optionally, the processing unit 302 is further configured to receive a storage address sent by the home storage controller corresponding to the to-be-read/written storage unit, and forward the received storage address to the host device, so that the host device operates, according to the storage address, data corresponding to the IO read/write instruction, where the storage address is allocated from a cache or memory of the home storage controller for the IO read/write instruction after the home storage controller corresponding to the to-be-read/written storage unit receives the IO read/write instruction.

According to the technical solution provided in the embodiment of the present disclosure, the processing unit 302 in the distribution apparatus 300 can receive the storage address sent by the home storage controller corresponding to the to-be-read/written storage unit, and return the storage address to the host device that sends the IO read/write instruction, which completes preparation work for subsequent data transmission between the host device and the storage controllers, and avoids a defect of heavy load and low performance of a processor (for example, 103-1) in the prior art caused due to that the processor needs to implement receiving and distribution of all packets (data and instructions), thereby improving IO read/write performance of the storage system.

Further, a Peripheral Component Interconnect Express PCIe link may be used for connection between the front-end interface 301 and the processing unit 302, and the processing unit 302 is configured as a PCIe root complex (PCIe RC) of the front-end interface 301. The front-end interface 301 is specifically configured to receive the IO read/write instruction sent by the host device, and send the IO read/write instruction to the PCIe root complex (namely, the processing unit 302). The processing unit 302, as the PCIe root complex, is specifically configured to receive the IO read/write instruction sent by the front-end interface.

Likewise, a PCIe link may also be used for connection between each back-end interface (the back-end interface 303 or 304 in the figure) and the processing unit 302, the processing unit 302 is also configured as a PCIe root complex (PCIe RC) of each back-end interface, and each back-end interface is connected, by using a PCIe non-transparent bridge (PCIe NTB), to each storage controller that is connected in a one-to-one correspondence manner.

The processing unit 302 is specifically configured to: after receiving the IO read/write instruction, determine the back-end interface (specifically, an NTB port number) connected to the home storage controller corresponding to the to-be-read/written storage unit; fill a destination address of a packet that includes the IO read/write instruction as an address of the back-end interface connected to the home storage controller corresponding to the to-be-read/written storage unit; and send the IO read/write instruction to the back-end interface connected to the home storage controller corresponding to the to-be-read/written storage unit.

The back-end interface connected to the home storage controller corresponding to the to-be-read/written storage unit is configured to: receive the IO read/write instruction that is sent by the processing unit 302 by using the PCIe link; map the destination address of the packet that includes the IO read/write instruction to an address of the home storage controller corresponding to the to-be-read/written storage unit; and send the IO read/write instruction by using the PCIe non-transparent bridge.

Further, in a specific implementation process, the distribution apparatus 300 further includes a switch unit (not shown), where each of the foregoing back-end interfaces is provided in the switch unit (because the PCIe NTB is essentially: performing mapping between memories of two domains, writing packet data at an address mapped by the peer, and then writing data at an address of the peer by using the NTB, where the switch unit herein is configured to implement this work). Preferably, in a specific implementation process, the switch unit may be a commercial multi-port PCIe switch chip.

Figure 4:
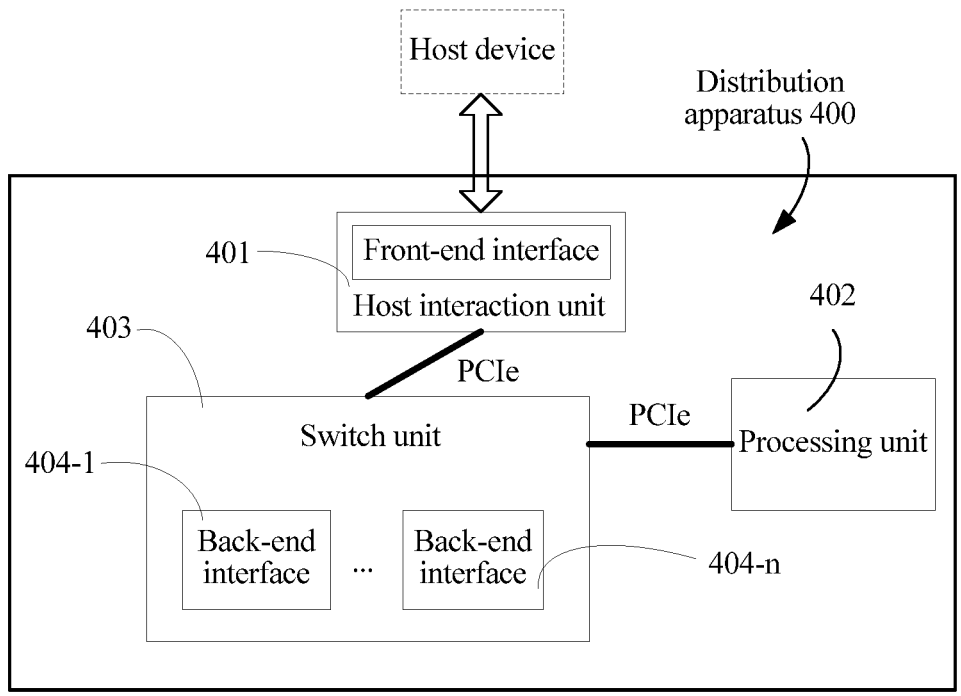
FIG. 4 is a schematic diagram of a logical structure of a distribution apparatus 400 according to an embodiment of the present disclosure.

FIG. 4 is a schematic diagram of a logical structure of a distribution apparatus 400 according to an embodiment of the present disclosure. The following describes in detail the distribution apparatus 400, and meanwhile, in this embodiment, a well-known method, process, component and circuit are not described in detail, to avoid unnecessarily blurring this embodiment.

As shown in FIG. 4, the distribution apparatus 400 includes a processing unit 402, a host interaction unit 401 (as described in the foregoing, a quantity of the host interaction unit 401 does not constitute a limitation on this embodiment of the present disclosure), and a switch unit 403. The host interaction unit 401 is connected to the processing unit 402 by using the switch unit 403.

The host interaction unit 401 is provided with a front-end interface (as described in the foregoing, a quantity of the front-end interface on the host interaction unit 401 does not constitute a limitation on this embodiment of the present disclosure), where the front-end interface is configured to connect to a host device. The switch unit 403 includes at least two back-end interfaces 404-1 and 404-*n* (for ease of description, as an example instead of a limitation, FIG. 4 shows only two back-end interfaces 404-1 and 404-*n*). Functions of the front-end interface (not numbered) and the back-end interfaces 404-1 and 404-*n* are similar to those of the front-end interface and the back-end interfaces in the embodiments of FIG. 2 and FIG. 3, and details are not described herein again. Merely as an example instead of a limitation, when the distribution apparatus 400 is applied in the storage system 200, the switch unit 403 is configured to separately connect to the at least two storage controllers 221-1 and 221-2. Specifically, the at least two back-end interfaces 404-1 and 404-*n* on the switch unit 403 are connected to the at least two storage controllers 221-1 and 221-2 in a one-to-one correspondence manner. For example, the back-end interface 404-1 is connected to the storage controller 221-1, and the back-end interface 404-*n* is connected to the storage controller 221-2 (not shown).

The processing unit 402 is configured to: acquire, by using the switch unit 403, an IO read/write instruction that is sent by the host device and that is received by the front-end interface on the host interaction unit 401; determine, according to an identifier that is of a to-be-read/written storage unit and that is carried in the IO read/write instruction, a home storage controller corresponding to the to-be-read/written storage unit; and forward, by using a back-end interface that is connected to the home storage controller corresponding to the to-be-read/written storage unit and that is in the switch unit 403, the IO read/write instruction to the home storage controller corresponding to the to-be-read/written storage unit.

According to the technical solution provided in this embodiment of the present disclosure, the front-end interface on the distribution apparatus 400 is decoupled from the storage controllers. The front-end interface is responsible for receiving the IO read/write instruction sent by the host device, the IO read/write instruction is sent to the processing unit 402 by using the switch unit 403, the processing unit 402 is responsible for determining a storage controller to which the IO read/write instruction is to be sent (the home storage controller corresponding to the to-be-read/written storage unit carried in the IO read/write instruction), and the back-end interface that is connected to the home storage controller corresponding to the to-be-read/written storage unit and that is in the switch unit 403 sends the IO read/write instruction to the storage controller determined by the processing unit, which avoids forwarding of an IO read/write instruction between storage controllers in the prior art, and reduces a transmission delay of the IO read/write instruction.

Further, a Peripheral Component Interconnect Express PCIe link may be used for both connection between the switch unit 403 and the processing unit 402 and connection between the switch unit 403 and the host interaction unit 401, and the processing unit 402 is configured as a PCIe root complex (PCIe RC) of the host interaction unit 401 and the switch unit 403. The host interaction unit 401 is specifically configured to receive, by using the front-end interface, the IO read/write instruction sent by the host device, and send the IO read/write instruction to the PCIe root complex (namely, the processing unit 402) by using the switch unit 403 (certainly, the host interaction unit 401 is specifically configured to convert, into a data packet using a PCIe communications protocol, a data packet that carries the IO read/write instruction and that is sent by the host device, and then send the data packet using the PCIe communications protocol to the switch unit 403). The processing unit 402, as the PCIe root complex, is specifically configured to receive the IO read/write instruction that is sent by the host interaction unit 401 by using the switch unit 403. In a specific implementation process, after the processing unit 402 parses the IO read/write instruction to determine the back-end interface connected to the home storage controller corresponding to the to-be-read/written storage unit (carried in the IO read/write instruction), the processing unit 402 fills, according to the PCIe communications protocol, a destination address of a communication packet that carries the IO read/write instruction as an address of the back-end interface that is connected to the home storage controller corresponding to the to-be-read/written storage unit and that is in the switch unit 403, and sends the communication packet with the address of the back-end interface to the switch unit 403. After receiving the PCIe communication packet that carries the IO read/write instruction, the switch unit 403 distributes the communication packet to the back-end interface connected to the home storage controller corresponding to the to-be-read/written storage unit, and the back-end interface distributes the IO read/write instruction to a storage controller connected to the back-end interface.

Further, considering that the distribution apparatus and the at least two storage controllers may be located in different PCIe domains, to facilitate communication between the distribution apparatus and the storage controllers, and specifically, to facilitate communication between the switch unit 403 and the at least two storage controllers, the switch unit 403 may communicate with the at least two storage controllers by using a PCIe non-transparent bridge (PCIe NTB), specifically, the at least two back-end interfaces 404-1 and 404-2 are connected, by using a PCIe NTB communications mechanism, to the storage controllers that are connected in a one-to-one correspondence manner.

In this case, after receiving the IO read/write instruction, the back-end interface connected to the home storage controller corresponding to the to-be-read/written storage unit maps the destination address of the IO read/write instruction to an address of the home storage controller corresponding to the to-be-read/written storage unit (by using the PCIe NTB communications mechanism), and sends the IO read/write instruction by using the PCIe non-transparent bridge.

It should be noted that in a specific implementation process, the switch unit 403 may be a commercial multi-port PCIe switch chip.

Figure 5:
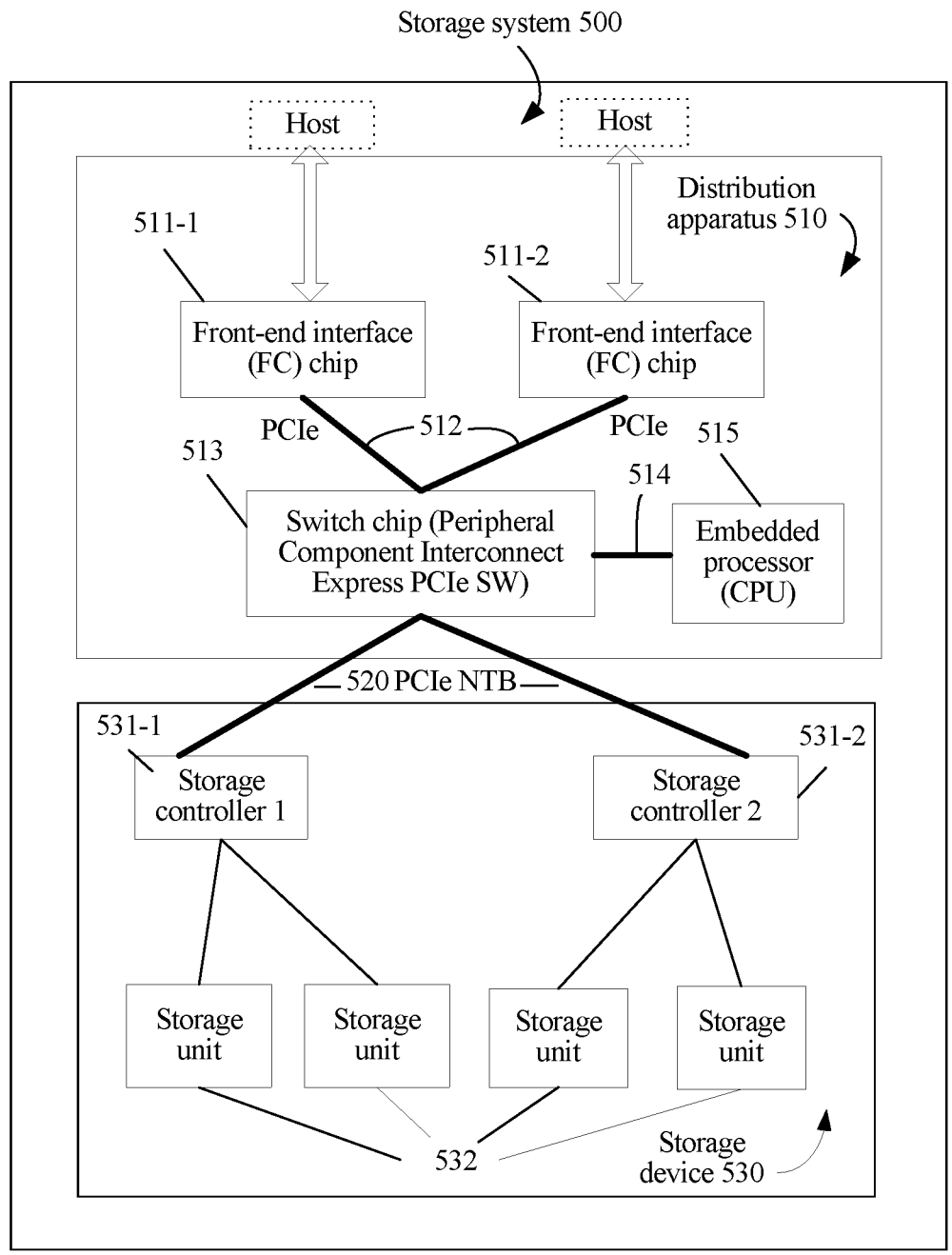
FIG. 5 is a schematic diagram of a logical structure of a storage system 500 according to an embodiment of the present disclosure.

FIG. 5 is a schematic diagram of a logical structure of a storage system 500 according to an embodiment of the present disclosure, where the storage system 500 includes a distribution apparatus 510, a connection link 520, and a storage device 530.

The storage device 530 includes storage controllers 531-1 and 531-2 (similar to those in FIG. 2, where the embodiment of this solution does not limit a quantity of the storage controllers either), and multiple storage units 532, where each storage unit is configured with either one of the two storage controllers 531-1 and 531-2 as a home storage controller. Similar to the embodiment corresponding to FIG. 2, the multiple storage units 532 may be implemented by using nonvolatile storage apparatuses of multiple types. In specific implementation, communication between the multiple storage units 532 and the storage controllers 531-1 and 531-2 may be implemented in multiple connection manners, which does not constitute a limitation on this embodiment of this solution.

In specific implementation, the connection link 520 may be constructed and implemented in a manner of, for example but not limited to, a hardware plug-in card, a cable, or an optical cable. The connection link 520 in this embodiment uses a Peripheral Component Interconnect Express non-transparent bridge PCIe NTB for communication.

The distribution apparatus 510 includes front-end interface chips 511-1 and 511-2, a switch chip 513, an embedded processor CPU 515, and a bus 512 and a bus 514 (for example but not limited to, a PCIe bus). The front-end interface chips 511-1 and 511-2 are the host interaction unit described in the foregoing embodiments. For example, the front-end interface chips 511-1 and 511-2 are corresponding to the host interaction unit 401 in FIG. 4. The switch chip 513 is corresponding to the switch unit described in the foregoing embodiments, for example, the switch unit 403 in FIG. 4. The embedded processor CPU 515 may be corresponding to the processing unit 402 in FIG. 4.

Optionally, the front-end interface chips 511-1 and 511-2 are commercial Fibre Channel FC (Fibre Channel) interface chips, where the FC interface chip may convert, into a communications protocol packet used in the distribution apparatus, a data packet that uses an FC protocol and that is received by the FC interface chip, for example, a data packet using a PCIe protocol (meanwhile, it should be noted that the front-end interface chips 511-1 and 511-2 may also be ATA interface chips, SCSI/iSCSI interface chips, or SAS interface chips, and a quantity of the front-end interface chips depends on a requirement and a processing capability of the storage system for an IO port; this embodiment of the present disclosure does not limit a quantity of the front-end interfaces, and two front-end interface chips are used merely to help describe this solution).

For the switch chip 513, optionally, a Peripheral Component Interconnect Express chip PCIe switch card is used as the switch chip herein.

The switch chip 513 is connected to the front-end interface chips 511-1 and 511-2 by using the bus 512, and the switch chip 513 is further connected to the embedded storage processor 515 by using the bus 514. The bus 512 and the bus 514 may be any one of types of bus structures, and include any one of a storage bus or a storage controller bus, a peripheral bus, and a local area bus that use various bus system structures. Optionally, the bus 512 and the bus 514 in this embodiment are both Peripheral Component Interconnect Express PCIe buses. Accordingly, the embedded processor 515 is configured as a root complex (PCIe Root Complex) of the front-end interface chips 511-1 and 511-2 and the switch chip 513.

For the foregoing distribution apparatus 510, specifically, the switch chip 513 in the distribution apparatus 510 separately establishes a connection with the foregoing two storage controllers 531-1 and 531-2 by using the connection link 520. Optionally, when the connection link 520 is constructed in a manner of a hardware plug-in card and uses the PCIe NTB for communication, the foregoing two storage controllers 531-1 and 531-2 are separately corresponding to different PCIe NTB ports (not shown) on the switch chip 513, specifically, the two storage controllers are connected in a one-to-one correspondence manner to the PCIe NTB ports that are corresponding to the two storage controllers and that are on the switch chip 513. As described in the embodiment of FIG. 2, the one-to-one correspondence is not unchangeable but is dynamically adjustable, and details are not described herein again.

The following describes in detail internal functions and operations of the storage system 500.

In this embodiment, a host device sends an IO read/write instruction to the distribution apparatus 510 by using the front-end interface chip 511-1 or 511-2 (in this case, a communications protocol conversion operation may be performed on a data packet, and the operation may be implemented by the front-end interface chip), where the IO read/write instruction carries an identifier of a to-be-read/written storage unit. Optionally, the identifier of the to-be-read/written storage unit is a logical unit number (LUN) of the to-be-read/written storage unit. After receiving the IO read/write instruction, the distribution apparatus 510 determines, according to the identifier of the to-be-read/written storage unit, a controller that is used to receive the IO read/write instruction. As an example instead of a limitation, the distribution apparatus 510 (specifically, the embedded processor 515 in the distribution apparatus) searches route configuration information prestored in the distribution apparatus to determine a storage controller corresponding to the identifier (the LUN number) of the to-be-read/written storage unit, where the route configuration information is used to record a correspondence between each storage unit and a home storage controller configured for each storage unit. Optionally, the route configuration information is stored in the processor 515.

After the embedded processor 515 determines the storage controller homing the to-be-read/written storage unit carried in the foregoing IO read/write instruction, the embedded processor 515 returns the IO read/write instruction to the PCIe switch chip 513 by using the bus 514, and the PCIe switch chip 513 forwards the foregoing IO read/write instruction to a controller homing the IO read/write instruction to obtain a storage address. In a specific implementation process, after the embedded processor 515 parses the IO read/write instruction to determine a back-end interface connected to the home storage controller corresponding to the to-be-read/written storage unit (carried in the IO read/write instruction), the embedded processor 515 fills, according to a PCIe communications protocol, a destination address of a communication packet that carries the IO read/write instruction as an address of the back-end interface that is connected to the home storage controller corresponding to the to-be-read/written storage unit and that is in the switch chip 513, and sends the communication packet with the address of the back-end interface to the switch chip 513. After receiving the PCIe communication packet that carries the IO read/write instruction, the switch chip 513 distributes, by using the back-end interface connected to the home storage controller corresponding to the to-be-read/written storage unit, the IO read/write instruction to the home storage controller corresponding to the to-be-read/written storage unit.

According to the technical solution provided in this embodiment of the present disclosure, the front-end interfaces 511-1 and 511-2 on the distribution apparatus 510 are both decoupled from the storage controllers. The front-end interfaces 511-1 and 511-2 are responsible for receiving the IO read/write instruction sent by the host device, the IO read/write instruction is sent to the embedded processor 515 by using the switch chip 513, the embedded processor 515 is responsible for determining a storage controller to which the IO read/write instruction is to be sent (the home storage controller corresponding to the to-be-read/written storage unit carried in the IO read/write instruction), and the back-end interface that is connected to the home storage controller corresponding to the to-be-read/written storage unit and that is in the switch chip 513 sends the IO read/write instruction to the storage controller determined by the processing unit, which avoids forwarding of an IO read/write instruction between storage controllers in the prior art, and reduces a transmission delay of the IO read/write instruction.

It is assumed that the controller homing the IO read/write instruction is the storage controller 531-1; then, after receiving the IO read/write instruction forwarded by the distribution apparatus 510 (specifically, the PCIe switch chip 513), the storage controller 531-1 allocates storage space (specifically, allocates the storage address) from a cache or memory of the storage controller 531-1 for the IO read/write instruction. It should be noted that in an actual operation, generally the storage space allocated by the storage controller 531-1 is not a segment of consecutive address space in most cases but a random or discrete address space set. Therefore, to facilitate subsequent DMA data transmission with the host device, the storage controller 531-1 expresses an address of the allocated storage space in a form of an SGL (Scatter Gather List) scatter/gather list. Then, optionally, the storage controller 531-1 sends, by using the PCIe NTB, the SGL address of the allocated storage space to the distribution apparatus 510 (specifically, the PCIe switch chip 513). After receiving the SGL address, the distribution apparatus 510 forwards, by using the front-end interface chip 511-1 or 511-2, the SGL address to the foregoing host device that sends the 10 read/write instruction. After receiving the SGL address, the host device starts a Direct Memory Access (DMA) direct memory access module to directly perform data transmission with the foregoing storage controller 531-1.

Specifically, when the IO read/write instruction is a write operation instruction, after receiving the SGL address, the host device writes, in the foregoing DMA manner into the storage space indicated by the foregoing SGL address, data corresponding to the IO read/write instruction. When the IO read/write instruction is a read operation instruction, after receiving the SGL address, the host device reads data corresponding to the IO read/write instruction from the storage space indicated by the foregoing SGL address. Optionally, the data may be hotspot data cached in the cache or memory of the storage controller 531-1 or data that is, after the storage controller 531-1 receives the IO read/write instruction, invoked from a side of a storage medium and stored in the cache or memory of the storage controller 531-1. (It should be noted that, to ensure DMA between channels in the system, the storage controllers in the storage system need to be separately allocated with different address space.)

In this embodiment of the present disclosure, after receiving the IO read/write instruction, the home storage controller corresponding to the to-be-read/written storage unit can allocate the storage address from the cache or memory of the home storage controller for the IO read/write instruction, and send the storage address to the distribution apparatus, so that the distribution apparatus forwards the storage address to the host device. Therefore, the host device can directly learn an operation address of the data corresponding to the IO read/write instruction, and write the data into the operation address in the DMA manner or read the data from the operation address in the DMA manner, which avoids a defect of a large scale of system data exchange caused by receiving data at and forwarding data between different storage controllers, and also reduces a delay brought by data exchange between the storage controllers.

Now, a storage device is described in detail, where the storage device is roughly the same as the storage device in FIG. 2 and FIG. 5. Herein the storage device 220 in FIG. 2 is used as an example for description. The storage device 220 includes at least two storage controllers (FIG. 2 shows only 221-1 and 221-2) and multiple storage units (222-1 to 222-*n*). For ease of description, herein the storage controller 221-1 is used as an example. One end of the storage controller 221-1 is configured to connect to the storage units 222-1 and 222-2 homed by the storage controller 221-1; another end of the storage controller 221-1 is configured to connect to a distribution apparatus 210, and specifically, to a back-end interface (not shown) that is corresponding to the storage controller 221-1 and that is in many back-end interfaces included in the distribution apparatus 210.

The storage controller (221-1 is used as an example) is configured to acquire information that is about the storage units (222-1 and 222-2) homed by the storage controller and that is initially configured in the system, and send, to the distribution apparatus, the acquired information that is about the storage units homed by the storage controller and that is initially configured in the system. The storage controller 221-2 also has the foregoing functions. The distribution apparatus establishes route configuration information according to the information that is about the storage units homed by the storage controllers 221-1 and 221-2, that is initially configured in the system, and that is sent by the storage controllers 221-1 and 221-2, where the route configuration information is used to record a correspondence between each storage unit and a home storage controller configured for each storage unit.

In this embodiment of the present disclosure, the storage controllers 221-1 and 221-2 can separately acquire information that is about the storage units separately homed by the storage controllers and that is initially configured in the system, and send, to the distribution apparatus, the information that is about the storage units separately homed by the storage controllers and that is initially configured in the system. Therefore, the distribution apparatus can establish the route configuration information according to the information that is about the storage units separately homed by the storage controllers (221-1 and 221-2), that is initially configured in the system, and that is sent by the storage controllers 221-1 and 221-2, which helps the distribution apparatus determine a home storage controller of a to-be-read/written storage unit carried in an IO read/write instruction, thereby improving efficiency in distributing the IO read/write instruction by the system.

Optionally, in a specific implementation process, the storage controllers 221-1 and 221-2 are specifically configured to establish a communication link to the distribution apparatus during system initialization, and send, to the distribution apparatus by using the communication link, the information that is about the storage units homed by the storage controllers 221-1 and 221-2 and that is initially configured in the system.

Optionally, in a specific implementation process, the storage controller 221-1 or 221-2 (that is, either one of the two is selected as a primary storage controller to negotiate and manage homing relationships of the storage units in the storage device) is further configured to send updated information about the storage units homed by the storage controllers 221-1 and 221-2, so that the distribution apparatus updates the route configuration information according to the received updated information about the storage units homed by the storage controllers 221-1 and 221-2.

The storage controller (221-1 is used as an example) is further configured to receive an IO read/write instruction that is from a host device and that is forwarded by the distribution apparatus, where the IO read/write instruction carries an identifier of the to-be-read/written storage unit (the to-be-read/written storage unit is 222-1 or 222-2). After receiving the IO read/write instruction, the storage controller 221-1 is configured to allocate a storage address for the IO read/write instruction according to the IO read/write instruction, where the storage address is located in a cache or memory of the storage controller 221-1, and send the storage address to the distribution apparatus.

Optionally, the IO read/write instruction is a write operation instruction, and the home storage controller (the storage controller 221-1) corresponding to the to-be-read/written storage unit is further configured to receive data that is corresponding to the IO read/write instruction and that is written at the storage address by the host device in a direct memory access DMA manner.

Optionally, the IO read/write instruction is a read operation instruction, and the home storage controller (the storage controller 221-1) corresponding to the to-be-read/written storage unit is further configured to receive a direct memory access DMA read request that is sent by the host device according to the storage address, and send, to the host device, data that is corresponding to the IO read/write instruction and that is at the storage address.

In a specific implementation process, when the IO read/write instruction is the read operation instruction, the home storage controller (the storage controller 221-1) corresponding to the to-be-read/written storage unit is specifically configured to: after receiving the read operation instruction, determine whether the data corresponding to the read operation instruction is saved in the cache or memory of the home storage controller; and if the data corresponding to the read operation instruction is saved in the cache or memory of the home storage controller, acquire the storage address of the data that is corresponding to the read operation instruction and that is in the cache or memory of the home storage controller; or if the data corresponding to the read operation instruction is not saved in the cache or memory of the home storage controller, read, from the to-be-read/written storage unit, the data corresponding to the read operation instruction, write the data into the cache or memory of the home storage controller, and use a written address as the storage address.

Figure 6:
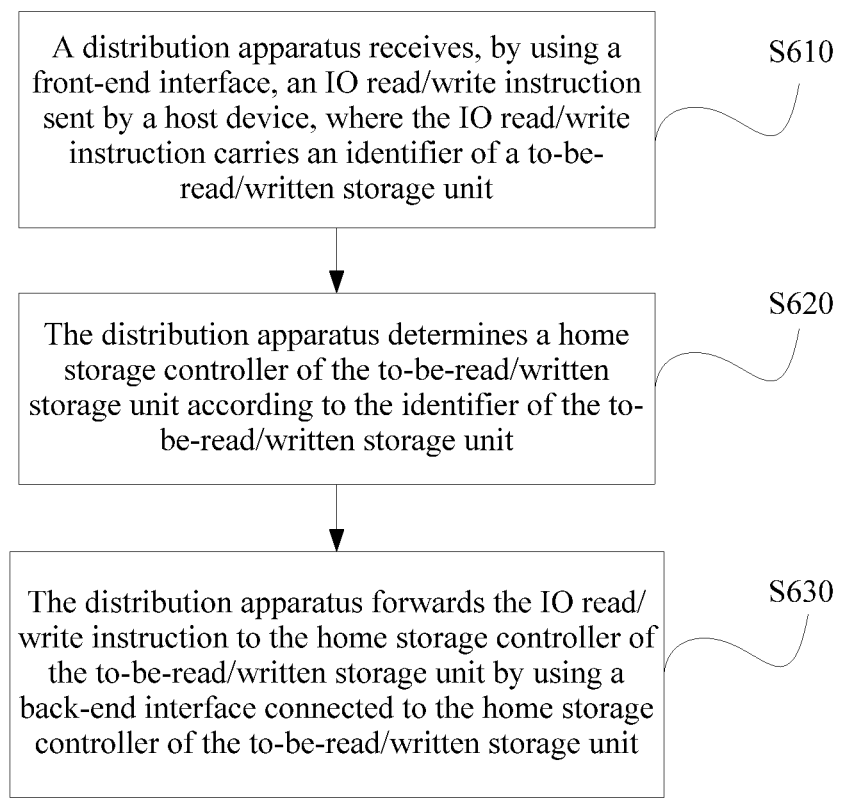
FIG. 6 is a flowchart of a data distribution method 600 according to an embodiment of the present disclosure.

FIG. 6 is a flowchart of a data distribution method 600 according to an embodiment of the present disclosure. The data distribution method 600 is applied in a storage system (merely as an example instead of a limitation, the storage system shown in FIG. 2 and FIG. 5). The storage system includes a distribution apparatus and a storage device, the storage device includes at least two storage controllers and multiple storage units, each storage unit is configured with any one of the at least two storage controllers as a home storage controller, the distribution apparatus includes a front-end interface and at least two back-end interfaces, the front-end interface is configured to connect to a host device, and each back-end interface is connected to each storage controller in a one-to-one correspondence manner. As shown in FIG. 6, the method 600 includes:

Step S610: The distribution apparatus receives, by using the front-end interface, an IO read/write instruction sent by the host device, where the IO read/write instruction carries an identifier of a to-be-read/written storage unit.

Step S620: The distribution apparatus determines a home storage controller of the to-be-read/written storage unit according to the identifier of the to-be-read/written storage unit.

Step S630: The distribution apparatus forwards the IO read/write instruction to the home storage controller of the to-be-read/written storage unit by using a back-end interface connected to the home storage controller of the to-be-read/written storage unit.

According to the technical solution provided in this embodiment of the present disclosure, the front-end interface of the distribution apparatus is decoupled from the storage controllers. The front-end interface is responsible for receiving the IO read/write instruction sent by the host device, a storage controller to which the IO read/write instruction is to be sent (the home storage controller corresponding to the to-be-read/written storage unit carried in the IO read/write instruction) is determined, and the back-end interface that is connected to the home storage controller corresponding to the to-be-read/written storage unit and that is in the distribution apparatus sends the IO read/write instruction to the home storage controller corresponding to the to-be-read/written storage unit, which avoids forwarding of an IO read/write instruction between storage controllers in the prior art, and reduces a transmission delay of the IO read/write instruction.

Optionally, after step S630, the method 600 further includes:

receiving, by the distribution apparatus, a storage address sent by the home storage controller of the to-be-read/written storage unit, where the storage address is allocated from a cache or memory of the home storage controller for the IO read/write instruction after the home storage controller corresponding to the to-be-read/written storage unit receives the IO read/write instruction; and forwarding, by the distribution apparatus, the storage address to the host device, so that the host device operates, according to the storage address, data corresponding to the IO read/write instruction.

Optionally, the IO read/write instruction is a write operation instruction, and after the forwarding, by the distribution apparatus, the storage address to the host device, the method 600 further includes:

receiving, by the distribution apparatus, a write operation end instruction sent by the host device, where the write operation end instruction is used to indicate that the host device has written, into the storage address in a direct memory access DMA manner, all data corresponding to the write operation instruction; and forwarding, by the distribution apparatus, the write operation end instruction to the home storage controller of the to-be-read/written storage unit.

Optionally, the IO read/write instruction is a read operation instruction, and after the forwarding, by the distribution apparatus, the storage address to the host device, the method 600 further includes:

receiving, by the distribution apparatus, a read operation end instruction sent by the home storage controller of the to-be-read/written storage unit, where the read operation end instruction is used to indicate that the home storage controller of the to-be-read/written storage unit has sent, to the host device in a direct memory access DMA manner, all data corresponding to the read operation instruction; and forwarding, by the distribution apparatus, the read operation end instruction to the host device.

Optionally, the determining, by the distribution apparatus, a home storage controller of the to-be-read/written storage unit according to the identifier of the to-be-read/written storage unit specifically includes:

searching, by the distribution apparatus, route configuration information according to the identifier that is of the to-be-read/written storage unit and that is carried in the IO read/write instruction, to determine the home storage controller corresponding to the to-be-read/written storage unit, where the route configuration information is used to record a correspondence between each storage unit and the home storage controller configured for each storage unit.

Optionally, before the receiving, by the distribution apparatus by using the front-end interface, an IO read/write instruction sent by the host device, the method 600 further includes:

receiving, by the distribution apparatus, information that is about a storage unit homed by each storage controller and that is initially configured in the system, and establishing the route configuration information according to the received information that is about the storage unit homed by each storage controller and that is initially configured in the system.

Optionally, after the establishing the route configuration information, the method 600 further includes:

receiving, by the distribution apparatus, updated information about the storage unit homed by each storage controller, and updating the route configuration information according to the received updated information about the storage unit homed by each storage controller.

Step S620 mentioned above in FIG. 6 may be specifically: searching, by the distribution apparatus, the route configuration information according to the identifier that is of the to-be-read/written storage unit and that is carried in the IO read/write instruction, to determine the home storage controller corresponding to the to-be-read/written storage unit. Now, a method for establishing the route configuration information is described in detail.

Figure 7:
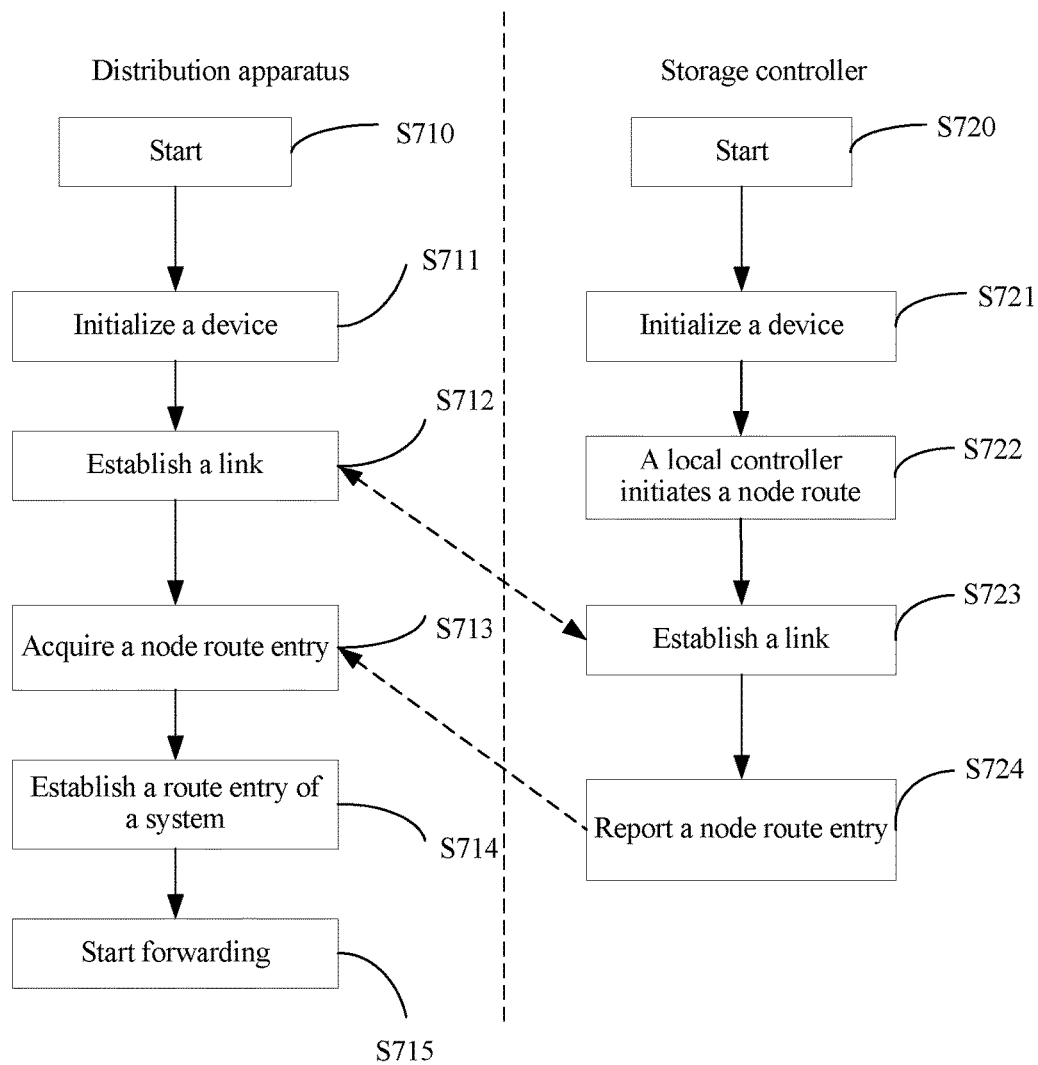
FIG. 7 is a flowchart of a method 700 for establishing route configuration information according to an embodiment of the present disclosure.

FIG. 7 is a flowchart of a method 700 for establishing route configuration information according to an embodiment of the present disclosure. As shown in FIG. 7, the method 700 for establishing route configuration information includes:

Steps S710 and S711 or steps S720 and S721: After a system is powered on, because a distribution apparatus (the following uses the distribution apparatus 210 in FIG. 2 as an example) and a storage controller (the following uses the storage controller 221-1 in FIG. 2 as an example) are completely independent components, the distribution apparatus and the storage controller each start independently and complete initialization.

Step S722: The storage controller 221-1 acquires an initial configuration of the system, where the initial configuration of the system is mainly information (LUN information) that is about a storage unit homed by the storage controller 221-1 and that is initially configured in the system, and establishes a node route entry of the storage controller 221-1, where the node route entry records a correspondence, initially configured in the system, between a LUN number of the storage unit homed by the storage controller 221-1 and the number 221-1 of the storage controller.

Step S712 or S723: The storage controller 221-1 attempts to establish a connection link to the distribution apparatus 210, where as an example instead of a limitation, the storage controller 221-1 establishes a connection link to the distribution apparatus 210 by using a PCIe NTB non-transparent bridge communications mechanism.

Step S713 or S724: After the connection link is established, the storage controller 221-1 sends the node route entry of the storage controller 221-1 to the distribution apparatus 210, and the distribution apparatus 210 acquires the node route entry.

Step S714: Another storage controller (for example, the storage controller 221-2 in FIG. 2) of the system completes starting and initialization in a manner same as that of the foregoing storage controller 221-1, establishes a connection link to the distribution apparatus 210, and sends a local node route entry (a node route entry of the storage controller 221-2) to the distribution apparatus 210. After acquiring the node route entry of each storage controller of the system, the distribution apparatus 210 establishes complete route configuration information.

Step S715: After completing establishing the route configuration information, the distribution apparatus 210 starts work of forwarding data.

In an actual application process, in order to ensure a dynamic balance of load on the storage controllers of the system, updated information about a storage unit homed by each storage controller may be further sent to the distribution apparatus 210, and the distribution apparatus 210 updates the route configuration information according to the received updated information about the storage unit homed by each storage controller. The updated information about the storage unit homed by each storage controller may be sent by a storage controller that is selected as a primary storage controller in the system or sent by a third-party management service node that is specifically configured to manage homing relationships of the storage units. As an example instead of a limitation, the route configuration information is shown in Table A, where a LUN ID (LUN number) indicates a LUN number of a storage unit that needs to be accessed for an IO read/write operation (specifically implemented by using an IO read/write instruction), where the IO read/write instruction includes a LUN ID of an access object. As shown in FIG. 2, when the distribution apparatus 210 is connected to the storage controllers by using a PCIe NTB interface (in a manner of a hardware plug-in card), a PORT ID indicates a number of a port that is corresponding to a PCIe NTB and that is on the distribution apparatus 210. Because each PCIe NTB port number is in one-to-one correspondence with a storage controller, actually, one PCIe NTB port number represents one storage controller. Therefore, a one-to-one correspondence between the LUN number of the storage unit that needs to be accessed for the IO operation and a storage controller in the system can be determined according to the route configuration information shown in Table A. In addition, the foregoing updated information about the storage unit homed by each storage controller refers to an update on at least one of, for example but not limited to, an entry 1, an entry 2, and an entry 3.

TABLE A

| Entry 1 | LUN ID1 | PORT ID1 |
| Entry 2 | LUN ID2 | PORT ID2 |
| Entry 3 | LUN ID3 | PORT ID3 |
| ... | ... | ... |
| Entry n | LUN IDn | PORT IDn |

For purposes of description, the foregoing description is made with reference to specific embodiments. However, the foregoing illustrative description does not intend to be exhaustive or limit the present disclosure to the disclosed precise forms. According to the foregoing teaching, multiple modifications and variations are all feasible. These embodiments are selected and described to describe a principle and an actual application of the present disclosure, so that a person skilled in the art can best use the present disclosure. Any modification, equivalent replacement, or improvement made without departing from the spirit and principle of the present disclosure shall fall within the protection scope of the present disclosure.

What is claimed is:

1. A storage system, comprising:
a storage device comprising at least two storage controllers and multiple storage units, wherein each storage unit is configured with any one of the at least two storage controllers as a home storage controller;
a distribution apparatus comprising:
a front-end interface configured to connect to a host device; and
at least two back-end interfaces, wherein each back-end interface is configured to connect to each storage controller in a one-to-one correspondence manner; and
wherein the distribution apparatus is configured to:
receive, using the front-end interface, an IO read/write instruction sent by the host device;
determine, according to an identifier of a to-be-read/written storage unit and carried in the IO read/write instruction, a home storage controller corresponding to the to-be-read/written storage unit;
forward, using a back-end interface connected to the home storage controller corresponding to the to-be-read/written storage unit, the IO read/write instruction to the home storage controller corresponding to the to-be-read/written storage unit;
save route configuration information, wherein the route configuration information is used to record a correspondence between each storage unit and the home storage controller configured for each storage unit;
search the route configuration information according to the identifier of the to-be-read/written storage unit and carried in the IO read/write instruction, to determine the home storage controller corresponding to the to-be-read/written storage unit;
receive information about a storage unit homed by each storage controller and initially configured in the system;
establish the route configuration information according to the received information about the storage unit homed by each storage controller and initially configured in the system;
receive updated information about the storage unit homed by each storage controller; and
update the route configuration information according to the received updated information about the storage unit homed by each storage controller; and
wherein each storage controller is further configured to establish a communication link to the distribution apparatus during system initialization; and
send, to the distribution apparatus using the communication link, the information about the storage unit homed by the storage controller and that is initially configured in the system.

2. The storage system according to claim 1, wherein the home storage controller corresponding to the to-be-read/written storage unit is further configured to:
after receiving the IO read/write instruction, allocate a storage address from a cache or memory of the home storage controller for the IO read/write instruction; and
send the storage address to the distribution apparatus; and
the distribution apparatus is further configured to forward the received storage address to the host device.

3. The storage system according to claim 2, wherein the IO read/write instruction is a write operation instruction, and the home storage controller corresponding to the to-be-read/written storage unit is further configured to receive data corresponding to the IO read/write instruction and written at the storage address by the host device in a direct memory access (DMA) manner.

4. The storage system according to claim 2, wherein the IO read/write instruction is a read operation instruction, and the home storage controller corresponding to the to-be-read/written storage unit is further configured to receive a direct memory access (DMA) read request sent by the host device according to the storage address, and send, to the host device, data corresponding to the IO read/write instruction and at the storage address.

5. The storage system according to claim 4, wherein the home storage controller corresponding to the to-be-read/written storage unit is configured to:

after receiving the read operation instruction, determine whether the data corresponding to the read operation instruction is saved in the cache or memory of the home storage controller; and if the data corresponding to the read operation instruction is saved in the cache or memory of the home storage controller, acquire the storage address of the data corresponding to the read operation instruction and in the cache or memory of the home storage controller; or if the data corresponding to the read operation instruction is not saved in the cache or memory of the home storage controller, read, from the to-be-read/written storage unit, the data corresponding to the read operation instruction, write the data into the cache or memory of the home storage controller, and use a written address as the storage address.

6. A storage system, comprising:
a storage device, comprising:
at least two storage controllers; and
multiple storage units, wherein each storage unit is configured with any one of the at least two storage controllers as a home storage controller;
a distribution apparatus, comprising:
a processing unit;
a host interaction unit; and
a switch unit coupled to the processing unit, wherein the host interaction unit is connected to the processing unit using the switch unit;
the host interaction unit is provided with a front-end interface, wherein the front-end interface is configured to connect to a host device, and the switch unit is provided with at least two back-end interfaces, wherein each back-end interface is connected to each storage controller in a one-to-one correspondence manner;
the host interaction unit is configured to:
receive, using the front-end interface, an IO read/write instruction sent by the host device; and
forward the IO read/write instruction to the processing unit using the switch unit; and
the processing unit is configured to:
receive the IO read/write instruction forwarded by the host interaction unit;
determine, according to an identifier of a to-be-read/written storage unit and carried in the IO read/write instruction, a home storage controller corresponding to the to-be-read/written storage unit;
forward, using a back-end interface connected to the home storage controller corresponding to the to-be-read/written storage unit and provided in the switch unit, the IO read/write instruction to the home storage controller corresponding to the to-be-read/written storage unit; and wherein
the distribution apparatus is further configured to save route configuration information, and the route configuration information is used to record a correspondence between each storage unit and the home storage controller configured for each storage unit;
the processing unit is configured to:
search the route configuration information according to the identifier of the to-be-read/written storage unit and carried in the IO read/write instruction, to determine the home storage controller corresponding to the to-be-read/written storage unit;
receive information about a storage unit homed by each storage controller and initially configured in the system; and establish the route configuration information according to the received information about the storage unit homed by each storage controller and initially configured in the system;
each storage controller is further configured to:
establish a communication link to the distribution apparatus during system initialization; and
send, to the processing unit of the distribution apparatus using the communication link, the information about the storage unit homed by the storage controller and initially configured in the system; and
the processing unit is further configured to:
receive updated information about the storage unit homed by each storage controller; and
update the route configuration information according to the received updated information about the storage unit homed by each storage controller.

7. The storage system according to claim 6, wherein a Peripheral Component Interconnect Express (PCIe) link is used for connection between the processing unit and the switch unit and between the host interaction unit and the switch unit, and the processing unit is configured as a PCIe root complex of the host interaction unit and each back-end interface;
the host interaction unit is configured to:
receive the IO read/write instruction sent by the host device; and
send the IO read/write instruction to the PCIe root complex using the PCIe link; and
the processing unit, as the PCIe root complex, is configured to receive the IO read/write instruction sent by the host interaction unit using the PCIe link.

8. The storage system according to claim 6, wherein each back-end interface is connected, using a Peripheral Component Interconnect Express (PCIe) none transparent bridge, to each storage controller that is connected in a one-to-one correspondence manner;
the processing unit is configured to:
after receiving the IO read/write instruction, determine a back-end interface connected to the home storage controller corresponding to the to-be-read/written storage unit;
fill a destination address of the IO read/write instruction as an address of the back-end interface connected to the home storage controller corresponding to the to-be-read/written storage unit; and
send the IO read/write instruction using the PCIe link; and
the back-end interface connected to the home storage controller corresponding to the to-be-read/written storage unit is configured to:
receive the IO read/write instruction;
map the destination address of the IO read/write instruction to an address of the home storage controller corresponding to the to-be-read/written storage unit; and
send the IO read/write instruction using the PCIe non-transparent bridge.

9. The storage system according to claim 6, wherein the home storage controller corresponding to the to-be-read/written storage unit is further configured to:
after receiving the IO read/write instruction, allocate a storage address from a cache or memory of the home storage controller for the IO read/write instruction; and
send the storage address to the processing unit of the distribution apparatus; and the processing unit is further configured to forward the received storage address to the host device so the host device operates, according to the storage address, data corresponding to the IO read/write instruction.

10. The storage system according to claim 9, wherein the IO read/write instruction is a write operation instruction, and the home storage controller corresponding to the to-be-read/written storage unit is further configured to receive the data corresponding to the IO read/write instruction written at the storage address by the host device in a direct memory access (DMA) manner.

11. The storage system according to claim 9, wherein the IO read/write instruction is a read operation instruction, and the home storage controller corresponding to the to-be-read/written storage unit is further configured to:
  receive a direct memory access (DMA) read request sent by the host device according to the storage address; and
  send, to the host device, the data corresponding to the IO read/write instruction and at the storage address.

12. The storage system according to claim 11, wherein the home storage controller corresponding to the to-be-read/written storage unit is configured to:
  after receiving the read operation instruction, determine whether the data corresponding to the read operation instruction is saved in the cache or memory of the home storage controller; and
  if the data corresponding to the read operation instruction is saved in the cache or memory of the home storage controller, acquire the storage address of the data corresponding to the read operation instruction and in the cache or memory of the home storage controller; or
  if the data corresponding to the read operation instruction is not saved in the cache or memory of the home storage controller, read, from the to-be-read/written storage unit, the data corresponding to the read operation instruction, write the data into the cache or memory of the home storage controller, and use a written address as the storage address.

13. A distribution apparatus, comprising:
  a processing unit,
  a host interaction unit, and
  a switch unit coupled to the processing unit, wherein the host interaction unit is connected to the processing unit using the switch unit;
  the host interaction unit is provided with a front-end interface, wherein the front-end interface is configured to connect to a host device; and the switch unit is provided with at least two back-end interfaces, and the at least two back-end interfaces are configured to connect to at least two storage controllers in a storage device, wherein each back-end interface is connected to each storage controller in a one-to-one correspondence manner, and each storage unit of the storage device is configured with any one of the at least two storage controllers as a home storage controller;
  the host interaction unit is configured to:
    receive, using the front-end interface, an IO read/write instruction sent by the host device;
    forward the IO read/write instruction to the processing unit using the switch unit;
  the processing unit is configured to:
    receive the IO read/write instruction forwarded by the host interaction unit;
    determine, according to an identifier of a to-be-read/written storage unit and carried in the IO read/write instruction, a home storage controller corresponding to the to-be-read/written storage unit;
    forward, using a back-end interface connected to the home storage controller corresponding to the to-be-read/written storage unit and provided in the switch unit, the IO read/write instruction to the home storage controller corresponding to the to-be-read/written storage unit; and wherein
  the distribution apparatus is further configured to:
    save route configuration information, and the route configuration information is used to record a correspondence between each storage unit and the home storage controller configured for each storage unit; and
  the processing unit is configured to:
    search the route configuration information according to the identifier of the to-be-read/written storage unit and carried in the IO read/write instruction, to determine the home storage controller corresponding to the to-be-read/written storage unit;
    receive information about a storage unit homed by each storage controller and initially configured in a system;
    establish the route configuration information according to the received information about the storage unit homed by each storage controller and initially configured in the system;
    receive updated information about the storage unit homed by each storage controller; and
    update the route configuration information according to the received updated information about the storage unit homed by each storage controller.

14. The distribution apparatus according to claim 13, wherein the processing unit is further configured to:
  receive a storage address sent by the home storage controller corresponding to the to-be-read/written storage unit; and
  forward the received storage address to the host device, so that the host device operates, according to the storage address, data corresponding to the IO read/write instruction,
  wherein the storage address is allocated from a cache or memory of the home storage controller for the IO read/write instruction after the home storage controller corresponding to the to-be-read/written storage unit receives the IO read/write instruction.

15. The distribution apparatus according to claim 13, wherein a Peripheral Component Interconnect Express (PCIe) link is used for connection between the processing unit and the switch unit and between the host interaction unit and the switch unit, and the processing unit is configured as a PCIe root complex of the host interaction unit and each back-end interface;
  the host interaction unit is configured to receive the IO read/write instruction sent by the host device, and send the IO read/write instruction to the PCIe root complex using the PCIe link; and
  the processing unit, as the PCIe root complex, is configured to receive the IO read/write instruction sent by the host interaction unit using the PCIe link.

16. The distribution apparatus according to claim 13, wherein each back-end interface is connected, using a Peripheral Component Interconnect Express (PCIe) non-transparent bridge, to each storage controller connected in a one-to-one correspondence manner;

the processing unit is configured to:
    after receiving the IO read/write instruction, determine the back-end interface connected to the home storage controller corresponding to the to-be-read/written storage unit;
    fill a destination address of the IO read/write instruction as an address of the back-end interface connected to the home storage controller corresponding to the to-be-read/written storage unit; and
    send the IO read/write instruction using the PCIe link; and
the back-end interface connected to the home storage controller corresponding to the to-be-read/written storage unit is configured to:
    receive the IO read/write instruction;
    map the destination address of the IO read/write instruction to an address of the home storage controller corresponding to the to-be-read/written storage unit; and
    send the IO read/write instruction using the PCIe non-transparent bridge.

17. A data distribution method applied in a storage system comprising a distribution apparatus and a storage device, the storage device comprises at least two storage controllers and multiple storage units, the distribution apparatus comprises a front-end interface and at least two back-end interfaces, the front-end interface is configured to connect to a host device, and each back-end interface is connected to each storage controller in a one-to-one correspondence manner; the method comprising:
    receiving, by the distribution apparatus using the front-end interface, an IO read/write instruction sent by the host device, wherein the IO read/write instruction carries an identifier of a to-be-read/written storage unit;
    determining, by the distribution apparatus, a home storage controller of the to-be-read/written storage unit according to the identifier of the to-be-read/written storage unit;
    forwarding, by the distribution apparatus, the IO read/write instruction to the home storage controller of the to-be-read/written storage unit using a back-end interface connected to the home storage controller of the to-be-read/written storage unit;
    when the IO read/write instruction is a write operation instruction, and after the forwarding step the method further comprises:
        receiving, by the distribution apparatus, a write operation end instruction sent by the host device, wherein the write operation end instruction is used to indicate that the host device has written, into a storage address in a direct memory access (DMA) manner, all data corresponding to the write operation instruction;
        forwarding, by the distribution apparatus, the write operation end instruction to the home storage controller of the to-be-read/written storage unit;
    when the IO read/write instruction is a read operation instruction, and after the forwarding step the method further comprises:
        receiving, by the distribution apparatus, a read operation end instruction sent by the home storage controller of the to-be-read/written storage unit, wherein the read operation end instruction is used to indicate that the home storage controller of the to-be-read/written storage unit has sent, to the host device in a direct memory access (DMA) manner, all data corresponding to the read operation instruction; and
        forwarding, by the distribution apparatus, the read operation end instruction to the host device;
    wherein the determining, by the distribution apparatus, a home storage controller of the to-be-read/written storage unit according to the identifier of the to-be-read/written storage unit comprises:
        searching, by the distribution apparatus, route configuration information according to the identifier of the to-be-read/written storage unit and carried in the IO read/write instruction, to determine the home storage controller corresponding to the to-be-read/written storage unit, wherein the route configuration information is used to record a correspondence between each storage unit and the home storage controller configured for each storage unit;
    wherein before the receiving, by the distribution apparatus using the front-end interface, an IO read/write instruction sent by the host device, the method further comprises:
        receiving, by the distribution apparatus, information about a storage unit homed by each storage controller and initially configured in the system, and establishing the route configuration information according to the received information about the storage unit homed by each storage controller and initially configured in the system; and
    wherein after the establishing the route configuration information, the method further comprises:
        receiving, by the distribution apparatus, updated information about the storage unit homed by each storage controller, and updating the route configuration information according to the received updated information about the storage unit homed by each storage controller.

18. The method according to claim 17, wherein the method further comprises:
    receiving, by the distribution apparatus, a storage address sent by the home storage controller of the to-be-read/written storage unit, wherein the storage address is allocated from a cache or memory of the home storage controller for the IO read/write instruction after the home storage controller corresponding to the to-be-read/written storage unit receives the IO read/write instruction; and
    forwarding, by the distribution apparatus, the storage address to the host device, so that the host device operates, according to the storage address, data corresponding to the IO read/write instruction.

* * * * *